(12) United States Patent
Ota et al.

(10) Patent No.: US 8,772,090 B2
(45) Date of Patent: Jul. 8, 2014

(54) METHOD OF MANUFACTURING SEMICONDUCTOR DEVICE

(71) Applicant: Renesas Electronics Corporation, Kanagawa (JP)

(72) Inventors: Yusuke Ota, Kanagawa (JP); Fukumi Shimizu, Hyogo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/898,834

(22) Filed: May 21, 2013

(65) Prior Publication Data

US 2013/0316500 A1 Nov. 28, 2013

(30) Foreign Application Priority Data

May 23, 2012 (JP) ................................. 2012-117490

(51) Int. Cl.
*H01L 21/00* (2006.01)

(52) U.S. Cl.
USPC .................... 438/123; 438/118; 257/E21.506

(58) Field of Classification Search
None
See application file for complete search history.

(56) References Cited

U.S. PATENT DOCUMENTS

| 6,744,118 B2 | 6/2004 | Ikenaga et al. |
| 2001/0042904 A1 | 11/2001 | Ikenaga et al. |

FOREIGN PATENT DOCUMENTS

| JP | 2001-320007 A | 11/2001 |
| JP | 2010-263066 A | 11/2010 |

*Primary Examiner* — Cheung Lee
(74) *Attorney, Agent, or Firm* — Mattingly & Malur, PC

(57) ABSTRACT

The method includes the steps of: providing a lead frame, including providing a concaved part in an upper face of a joint part of a die-pad-support lead of a lead frame for setting down a die pad and a tie-bar; bonding a semiconductor chip to a first principal face of the die pad via an adhesive-member layer; then, setting the lead frame between first and second molding dies having first and second cavities respectively so that the first and second cavities are opposed to each other, and the second principal face of the die pad faces toward the second cavity; and forming first and second resin sealed bodies on the sides of the first and second principal faces of the die pad respectively by resin sealing with the first and second molding dies clamping the tie-bar and a part of the lead frame surrounding the tie-bar.

14 Claims, 34 Drawing Sheets

US 8,772,090 B2

METHOD OF MANUFACTURING SEMICONDUCTOR DEVICE

CROSS-REFERENCE TO RELATED APPLICATIONS

The Present application claims priority from Japanese application JP 2012-117490 filed on May 23, 2012, the content of which is hereby incorporated by reference into this application.

BACKGROUND

The present invention relates to a method of manufacturing a semiconductor device (or a semiconductor integrated circuit device), and particularly to a technique useful in application to a resin molding technique.

Japanese Unexamined Patent Publication No. JP-A-2010-263066 relates to resin seal techniques such as QFP (Quad Flat Package), and QFN (Quad Flat Non-Leaded Package). Therein disclosed is a technique for providing a recess part in a gate insert piece in order to prevent an inner lead in a corner part from being deformed as a result of the concentration of a clamp pressure by a gate insert piece (Gate Insert Piece) of a mold.

JP-A-2001-320007, and U.S. Pat. No. 6,744,118 which is a counterpart thereof relate to a single-side collective mold in which a lead frame is used. Therein disclosed is a technique for performing half-etching on a tie-bar portion of a boundary portion between unit device regions to avoid various problems involved in package dicing.

SUMMARY

As to a mold process of a lead frame article, taking a transfer mold as an example, a resin is supplied to inside a cavity with a tie-bar (dam bar) of a lead frame clamped with a mold. In this step, the width of a clamp part is made larger than that of the tie-bar so that the tie-bar can be clamped with a clamp part of the mold with reliability. As a result, each of the leads (inner lead and outer lead), and a hanging lead (i.e. die-pad-support lead) is partially clamped with the mold. Then, clamping the hanging lead with the mold, the hanging lead is deformed by the clamp pressure, and thus the position of a die pad which the hanging lead is connected to is shifted upward or downward.

Now, it has been found from the study made by the inventor that there may be a risk of a package crack being caused if the die pad is shifted from a predetermined position toward the direction in which the die pad is offset. Specifically, the following has been clear: in regard to a lead frame having a die pad already set down at the time of molding, for example, if the die pad is shifted to a position below a predetermined position, a sealed body which is to be formed on the lower-face side of the die pad becomes thinner than a desired thickness and consequently, a stress applied to a sealed body formed on the lower-face side of the die pad can cause a package crack. Further, in regard to a lead frame having a die pad already set up at the time of molding, if the die pad is shifted to a position above a predetermined position, a sealed body to be formed on the upper-face side of the die pad becomes thinner than a desired thickness and therefore, a stress applied to the sealed body formed on the upper-face side of the die pad can cause a package crack.

While the means for solving the problem like this, and others will be described below, other problems and novel features thereof will become apparent from the description hereof and the accompanying drawings.

Of the embodiments herein disclosed, a representative embodiment will be briefly outlined below.

The method of manufacturing a double-side-resin-seal-type semiconductor device having leads on each side according to one embodiment hereof includes, in outline, providing a concaved part in upper or lower face of a joint part of a die-pad-support lead of a lead frame with a die pad set down and a tie-bar.

Of embodiments herein disclosed, a representative one brings about the effect as briefly described below.

According to one embodiment hereof, it is possible to prevent the deformation of a die-pad-support lead at the time of sealing the resin.

DETAILED DESCRIPTION

Summary of the Embodiments

Figure 1:
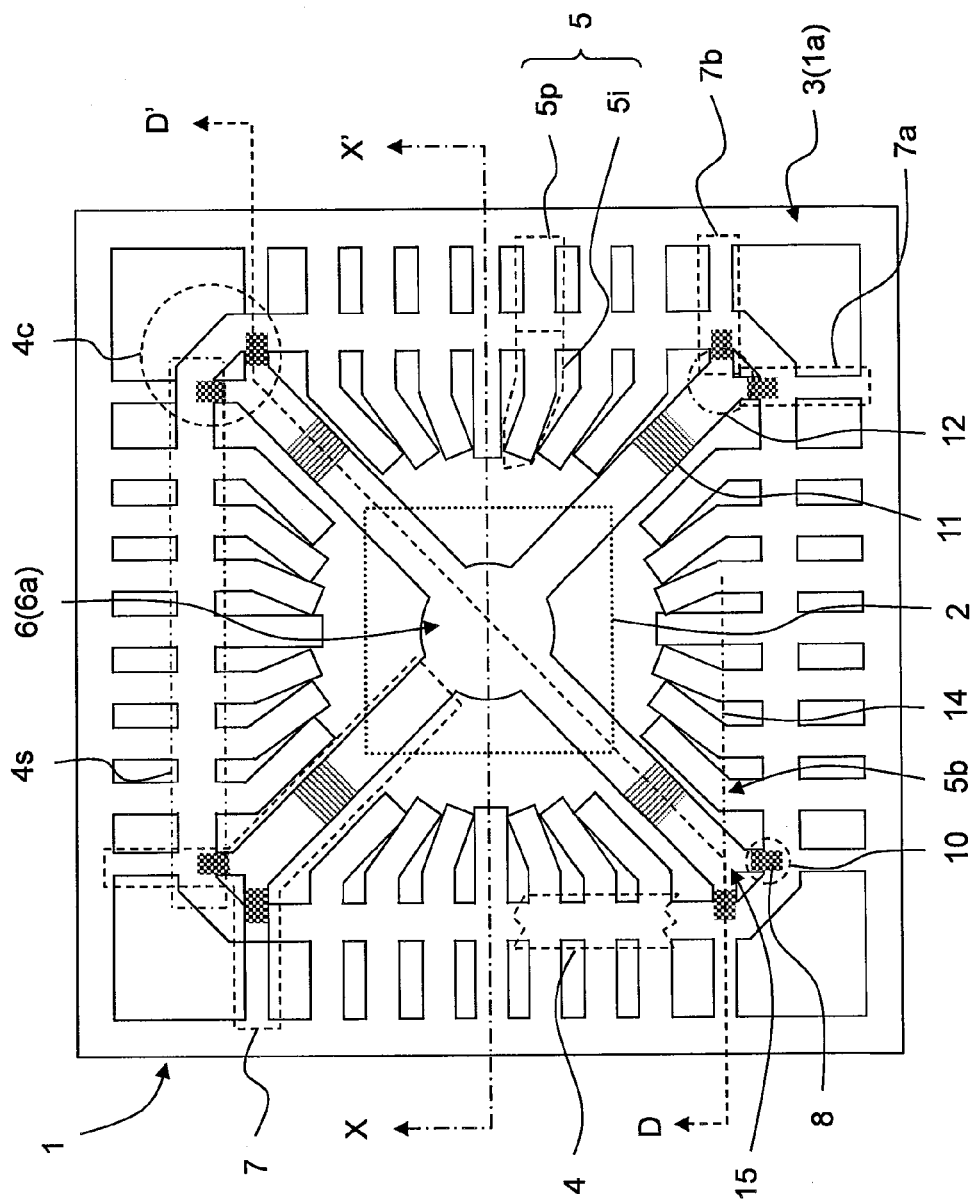
FIG. 1 is a top view of a lead frame in the course of an assembly process (at the time of completion of a lead frame preparation step) for explaining the first half of the assembly process(to the wire bonding)in a method of manufacturing a semiconductor device according to one embodiment hereof.

The representative embodiment herein disclosed will be outlined, first.

1. A method of manufacturing a semiconductor device includes the steps of:
(a) providing a lead frame having
 (x1) a substantially rectangular frame-like frame part,
 (x2) a substantially rectangular frame-like tie-bar which is supported by the frame part, and formed therein,
 (x3) a plurality of leads extending inward and outward from four sides of the tie-bar,
 (x4) a die pad which is formed inside from the tie-bar, and has first and second principal faces,
 (x5) a die-pad-support lead extending inward from each corner part of the tie-bar or a joint part near the corner part, and joined to the die pad,
 (x6) a concaved part formed on the side of the first or second principal face of the joint part, and
 (x7) a down-set part formed in each die-pad-support lead so as to set down the die pad on the side of the second principal face;
(b) bonding a semiconductor chip to the first principal face of the die pad via an adhesive-member layer;
(c) after the step (b), setting the lead frame between a first molding die having a first cavity and a second molding die having a second cavity so that the first and second cavities are opposed to each other, and the second principal face of the die pad faces toward the second cavity; and
(d) forming first and second resin sealed bodies on the sides of the first and second principal faces of the die pad respectively by executing resin sealing with the first and second molding dies clamping the tie-bar and a part of the lead frame surrounding the tie-bar.

2. In the method of manufacturing a semiconductor device as described in the item #1, the concaved part is formed on the side of the first principal face of the joint part.

3. In the method of manufacturing a semiconductor device as described in the item #1 or #2, the adhesive-member layer is a silver paste layer.

4. In the method of manufacturing a semiconductor device as described in any one of the items #1 to #3, the concaved part is formed by etching.

5. In the method of manufacturing a semiconductor device as described in any one of the items #1 to #4, the die pad is included in the semiconductor chip in plane view.

6. In the method of manufacturing a semiconductor device as described in any one of the items #1 to #5, in the step (d), the first cavity is included in the second cavity in plane view.

7. In the method of manufacturing a semiconductor device as described in any one of the items #1 to #6, the first resin-sealed body is thicker than the second resin-sealed body in thickness in a place where the semiconductor chip and the die pad are located.

8. In the method of manufacturing a semiconductor device as described in any one of the items #1 to #7, each die-pad-support lead has first and second branches on the tie-bar side; the first branch is joined to the tie-bar via a first joint part near one side of corresponding one corner part of the tie-bar; and the second branch is joined to the tie-bar via a second joint part near the other side of the corner part.

9. In the method of manufacturing a semiconductor device as described in the item #8, the concaved part is formed to extend outward from a branch part of the first and second branches to a depth of one half of the width inside the tie-bar belonging to the joint part along a direction of the width of the tie-bar.

10. In the method of manufacturing a semiconductor device as described in any one of the items #1 to #7, each die-pad-support lead has substantially no branch on its tie-bar side.

11. In the method of manufacturing a semiconductor device as described in the item #10, of the plurality of leads extending inward and outward from each side of the tie-bar, the leads at least adjacent to each die-pad-support lead each have a bent part inward from the tie-bar in the plane which the lead frame substantially belongs to.

12. In the method of manufacturing a semiconductor device as described in the item #11, the concaved part is formed to extend outward from an intersection point of a straight line running through the bent part in parallel with one side of the tie-bar closest to the concaved part, and the die-pad-support lead closest to the concaved part to a depth of one half of a width of the tie-bar inside the tie-bar belonging to the joint part.

13. A method of manufacturing a semiconductor device includes the steps of:
(a) providing a lead frame having
   (x1) a substantially rectangular frame-like frame part,
   (x2) a substantially rectangular frame-like tie-bar which is supported by the frame part, and formed inside therefrom,
   (x3) a plurality of leads extending inward and outward from each of four sides of the tie-bar,
   (x4) a die pad formed inside from the tie-bar, and having first and second principal faces,
   (x5) a die-pad-support lead extending inward from each corner part of the tie-bar or a joint part near the corner part, and joined to the die pad, and
   (x6) a down-set part formed in each die-pad-support lead so as to set down the die pad on the side of the second principal face;
(b) bonding a semiconductor chip to the first principal face of the die pad via an adhesive-member layer;
(c) after the step (b), setting the lead frame between a first molding die having a first cavity and a second molding die having a second cavity so that the first and second cavities are opposed to each other, and the second principal face of the die pad faces toward the second cavity; and
(d) forming first and second resin sealed bodies on the sides of the first and second principal faces of the die pad respectively by executing resin sealing with the first and second molding dies clamping the tie-bar and a part of the lead frame surrounding the tie-bar.

In the method, a clamp-face concaved part is formed in a part of the first or second molding die corresponding to the joint part.

14. In the method of manufacturing a semiconductor device as described in the item #13, the clamp-face concaved part is formed in the first molding die.

Next, the outline of other embodiments herein disclosed will be described.

1. A method of manufacturing a semiconductor device includes the steps of:
(a) providing a lead frame having
   (x1) a substantially rectangular frame-like frame part,
   (x2) a substantially rectangular frame-like tie-bar which is supported by the frame part, and formed therein,
   (x3) a plurality of leads extending inward and outward from four sides of the tie-bar,
   (x4) a die pad which is formed inside from the tie-bar, and has first and second principal faces,
   (x5) a die-pad-support lead extending inward from each corner part of the tie-bar or a joint part near the corner part, and joined to the die pad, and
   (x6) a concaved part formed on the side of the first or second principal face of the joint part,
(b) bonding a semiconductor chip to the first principal face of the die pad via an adhesive-member layer;
(c) after the step (b), setting the lead frame between a first molding die having a first cavity and a second molding die having a second cavity so that the first and second cavities are opposed to each other, and the second principal face of the die pad faces toward the second cavity; and
(d) forming first and second resin sealed bodies on the sides of the first and second principal faces of the die pad respectively by executing resin sealing with the first and second molding dies clamping the tie-bar and a part of the lead frame surrounding the tie-bar.

2. In the method of manufacturing a semiconductor device as described in the item #1, the concaved part is formed on the side of the first principal face of the joint part.

3. In the method of manufacturing a semiconductor device as described in the item #1 or #2, the adhesive-member layer is a silver paste layer.

4. In the method of manufacturing a semiconductor device as described in any one of the items #1 to #3, the concaved part is formed by etching.

5. In the method of manufacturing a semiconductor device as described in any one of the items #1 to #4, the die pad is included in the semiconductor chip in plane view.

6. In the method of manufacturing a semiconductor device as described in any one of the items #1 to #5, in the step (d), the first cavity is included in the second cavity in plane view.

7. In the method of manufacturing a semiconductor device as described in any one of the items #1 to #6, the first resin-sealed body is thicker than the second resin-sealed body in thickness in a place where the semiconductor chip and the die pad are located.

8. In the method of manufacturing a semiconductor device as described in any one of the items #1 to #7, each die-pad-support lead has first and second branches on the tie-bar side; the first branch is joined to the tie-bar via a first joint part near one side of corresponding one corner part of the tie-bar; and the second branch is joined to the tie-bar via a second joint part near the other side of the corner part.

9. In the method of manufacturing a semiconductor device as described in the item #8, the concaved part is formed to extend outward from a branch part of the first and second branches to a depth of one half of the width inside the tie-bar belonging to the joint part along a direction of the width of the tie-bar.

10. In the method of manufacturing a semiconductor device as described in any one of the items #1 to #7, each die-pad-support lead has substantially no branch on its tie-bar side.

11. In the method of manufacturing a semiconductor device as described in the item #10, of the plurality of leads extending inward and outward from each side of the tie-bar, the leads at least adjacent to each die-pad-support lead each have a bent part inward from the tie-bar in the plane which the lead frame substantially belongs to.

12. In the method of manufacturing a semiconductor device as described in the item #11, the concaved part is formed to extend outward from an intersection point of a straight line running through the bent part in parallel with one side of the tie-bar closest to the concaved part, and the die-pad-support lead closest to the concaved part to a depth of one half of a width of the tie-bar inside the tie-bar belonging to the joint part.

13. A method of manufacturing a semiconductor device includes the steps of:
(a) providing a lead frame having
 (x1) a substantially rectangular frame-like frame part,
 (x2) a substantially rectangular frame-like tie-bar which is supported by the frame part, and formed inside therefrom,
 (x3) a plurality of leads extending inward and outward from each of four sides of the tie-bar,
 (x4) a die pad formed inside from the tie-bar, and having first and second principal faces, and
 (x5) a die-pad-support lead extending inward from each corner part of the tie-bar or a joint part near the corner part, and joined to the die pad,
(b) bonding a semiconductor chip to the first principal face of the die pad via an adhesive-member layer;
(c) after the step (b), setting the lead frame between a first molding die having a first cavity and a second molding die having a second cavity so that the first and second cavities are opposed to each other, and the second principal face of the die pad faces toward the second cavity; and
(d) forming first and second resin sealed bodies on the sides of the first and second principal faces of the die pad respectively by executing resin sealing with the first and second molding dies clamping the tie-bar and a part of the lead frame surrounding the tie-bar.

In the method, a clamp-face concaved part is formed in a part of the first or second molding die corresponding to the joint part.

14. In the method of manufacturing a semiconductor device as described in the item #13, the clamp-face concaved part is formed in the first molding die.

The Descriptions of the Describing Form Herein, Basic Terms and the Usage Thereof 1. The description of each embodiment can be presented in two or more sections for the sake of convenience as required. However, the sections are not independent of each other, and describe the individual parts of one embodiment, or one of them describes the detail of the other, or part or all of the modification thereof except when clearly noted to the contrary. Further, as a rule, the iteration of the description about like parts shall be skipped. In addition, the respective constituents of the embodiment are not essential except when clearly noted to the contrary, when limited to that number theoretically, and when clearly specified to the contrary from the context.

Further, the term "semiconductor device" used herein primarily refers to a semiconductor chip or the like (e.g. a monocrystalline silicon substrate), into which various types of transistors (active elements), and resistances, capacitances and other elements arranged around the transistors are integrated. Representative examples of the various types of transistors include MISFET (Metal Insulator Semiconductor Field Effect Transistor) which is typified by MOSFET (Metal Oxide Semiconductor Field Effect Transistor). Representative examples of the integrated circuit structure in this case include CMIS (Complementary Metal Insulator Semiconductor) type integrated circuit which is typified by CMOS (Complementary Metal Oxide Semiconductor) type integrated circuit formed by a combination of an N-channel type MISFET and a P-channel type MISFET.

The wafer process of today's semiconductor device, i.e. LSI (Large Scale Integration) may be typically classified in two. The first is FEOL (Front End of Line) process from the loading of a silicon wafer as a raw material to the Premetal process (including the step of forming an interlayer dielectric film or the like between a M1 wiring layer's lower end and a gate electrode structure, the step of forming a contact hole, and the step of embedding a tungsten plug) or thereabout. The second is BEOL (Back End of Line) process from the step of forming the M1 wiring layer to the step of forming a pad opening in a final passivation film lying on an aluminum-based pad electrode or thereabout (in the case of a wafer-level package process, including the process).

Now, it is noted that "semiconductor device" includes a discrete electronic device like a power transistor.

2. Likewise, in the descriptions of the embodiments and others, even in the case of using the expression "X comprising A" in regard to a material, a composition or the like, the idea that an element other than A is one of primary constituents is not excluded except when clearly noted to the contrary and when clearly specified to the contrary from the context. For instance, in terms of a component, it represents "X including A as a primary component" or the like. Even in the case of using the term "silicon member", for instance, it is not limited to a pure silicon. It is obvious that the "silicon member" includes members of SiGe alloy and other multi-element alloys including silicon as a primary component, and other members including an additive and the like.

3. Likewise, when showing preferred embodiments for the graphic form, the position, the attribute, etc., it is obvious that the invention is not strictly limited to the embodiments except when clearly noted to the contrary, and when clearly specified to the contrary from the context.

4. Also, even if citing a certain numerical value and a certain quantity, the value or quantity concerned may be a value above or below the certain numerical value except when clearly noted to the contrary, when limited to that number theoretically, and when clearly specified to the contrary from the context.

5. Further, in the case of using the term "wafer", it usually refers to a monocrystalline silicon wafer to form a semiconductor device (which may be a semiconductor integrated circuit device, or an electronic device) thereon. However, it is obvious that the "wafer" includes a complex wafer of an insulative substrate, such as an epitaxial wafer, an SOI substrate or an LCD glass substrate, and a semiconductor layer or the like.

6. A tie-bar of a lead frame herein described has a substantially rectangular frame-like shape corresponding to the two-dimensional shape of a sealed body of a QFP-based package, which may have a chipped portion. The tie-bar is supported by a frame part through an exclusive-use support lead, an extension of a die-pad-support lead, an outside lead of a typical lead or the like.

The respective portions of the tie-bar corresponding to the four sides of the sealed body shall be hereinafter referred to as "tie-bar's four sides". In addition, the region (rectangular region) enclosed by the substantially rectangular tie-bar shall be referred to as "tie-bar interior", and the outside of the tie-bar which is located out of the rectangular region shall be referred to as "tie-bar exterior".

Further Detailed Description of the Embodiments

The embodiment will be described further in detail. In the drawings, the same or like parts are identified by the same or similar symbols, reference numerals, and the iteration of the description thereof shall be avoided as a rule.

Further, in the accompanying drawings, a processing such as hatching on even a cross section can be omitted in the case where such processing would make the drawing more complex, or the case where clear discrimination from a gap can be made. In this connection, a background border line can be omitted for even a hole which is closed in two dimensions if it is clear from the description thereof, or the like. Further, the hatching can be performed on a portion concerned to clearly show that it is not a gap even if the portion is not a cross section.

In regard to the way of alternatively terming two members or parts, in the case of referring to one member or part with the word "first" prefixed to the name thereof, and the other with the word "second" prefixed to the name thereof, the words "first" and "second" are associated with the members or parts according to the representative embodiment, and exemplified in some cases; it is obvious that even the member or part with "first" prefixed to the name thereof, for example, is not limited as exemplified.

1. Description of the first half stage (to the wire bonding) of an assembly process in a method of manufacturing a semiconductor device according to one embodiment hereof (see primarily FIGS. 1 to 9)

The embodiments will be concretely described below while chiefly taking, as an example, a QFP (Quad Flat Package) type device, specifically an LQFP (Low Profile Quad Flat Package) type device or a TQFP (Thin Quad Flat Package) type device. It is obvious that these embodiments are applicable to other double-side-seal type devices with a lead frame used therein and the like.

Further, as to the embodiment below, an example such that a concaved part is formed on the upper side of the lead frame will be described chiefly and concretely. However, it is obvious that the concaved part may be formed on the lower side of the lead frame.

While in regard to the embodiment below, a sealing method with a chip-mount side facing upward will be chiefly described for convenience of description, it is obvious that the sealing may be made with the chip-mount side facing downward.

As to the embodiment below, to avoid the complicated description, an example such that one chip is mounted on one die pad of a lead frame will be described concretely. However, it is obvious that more than one chip may be stacked on or arranged in a lateral direction of the one die pad.

For this embodiment, likewise to avoid the complicated description, a discrete unit device region of the lead frame will be described concretely. However, it is obvious that the lead frame may be composed of a plurality of unit device regions arrayed in a matrix.

Further, in the embodiment below, silver paste is described as die bonding means specifically. However, it is obvious that another kind of paste or DAF (Die Attach Film) may be used as the means.

Incidentally, in the embodiment below, for convenience of diagrammatic representation, the number of leads shown diagrammatically is about 30. However, the number of leads in an actual device is e.g. about 200 to 600 mostly.

Figure 2:
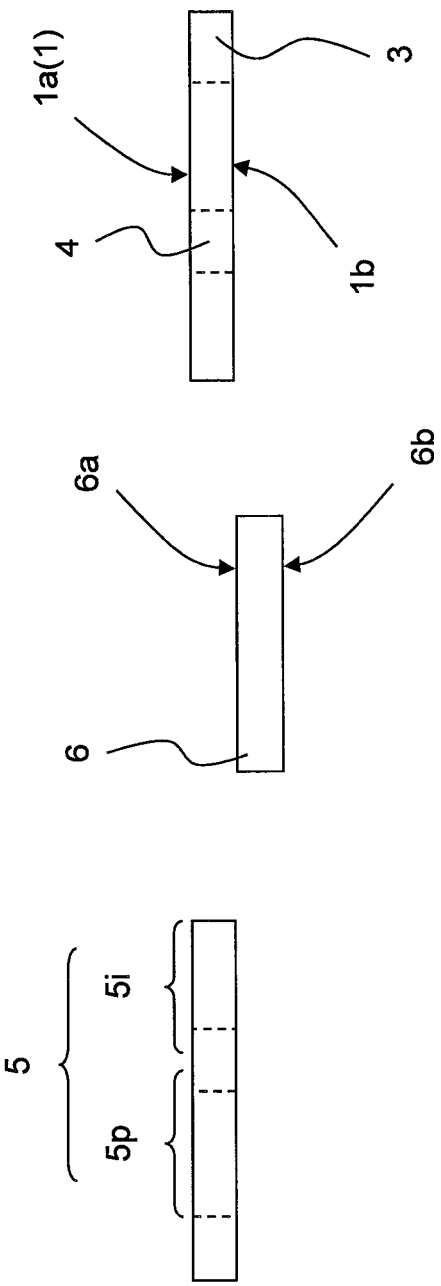
FIG. 2 is a sectional view showing a cross section of the lead frame of FIG. 1 taken along the line X-X'.
Figure 3:
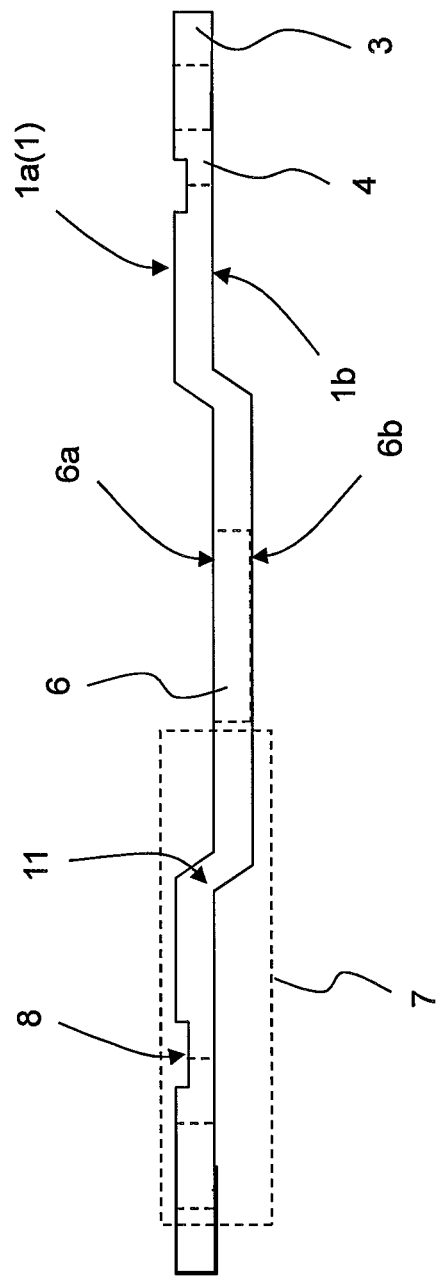
FIG. 3 is a sectional view showing a cross section of the lead frame of FIG. 1 taken along the line D-D'.
Figure 4:
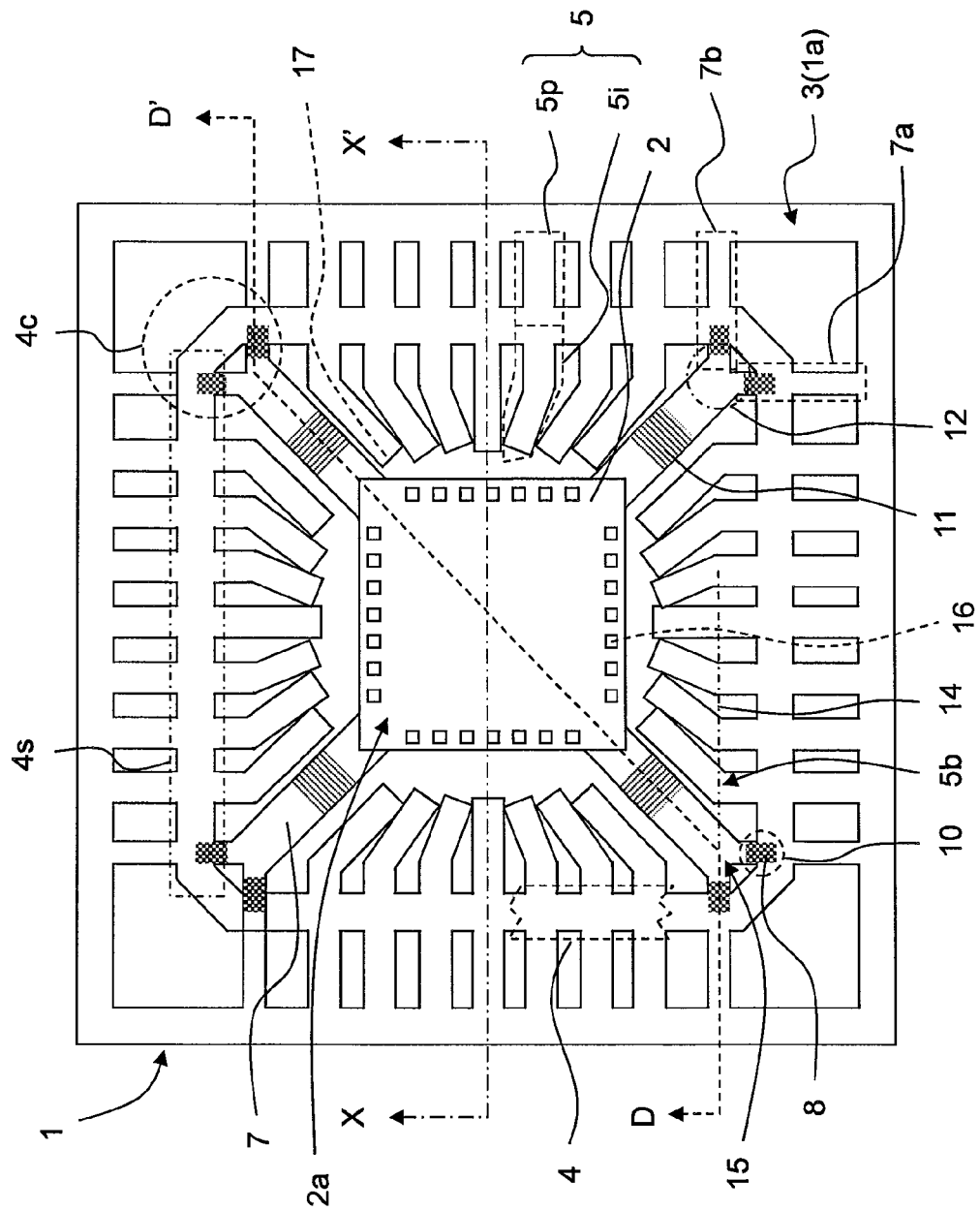
FIG. 4 is a top view of a lead frame in the course of an assembly process(at the time of completion of a die bonding step) for explaining the first half of the assembly process (to the wire bonding) in the method of manufacturing a semiconductor device according to the one embodiment.
Figure 5:
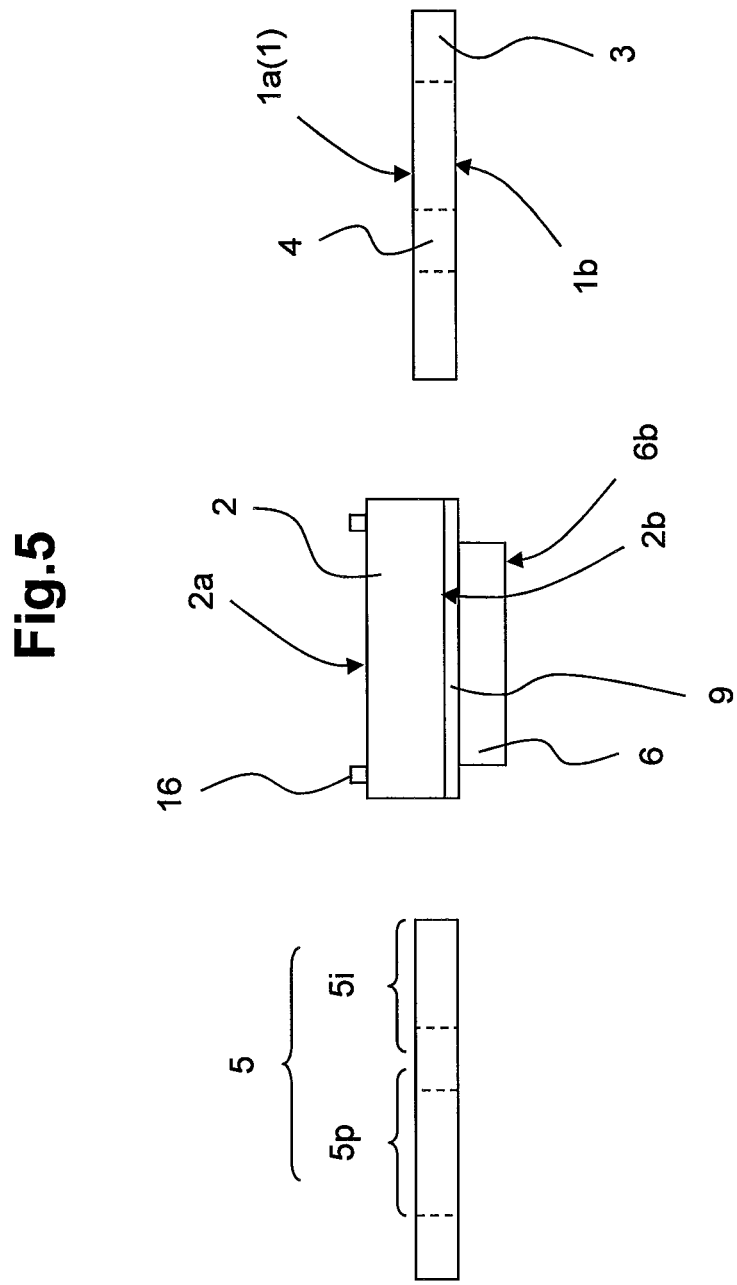
FIG. 5 is a sectional view showing a cross section of the lead frame of FIG. 4 taken along the line X-X'.
Figure 6:
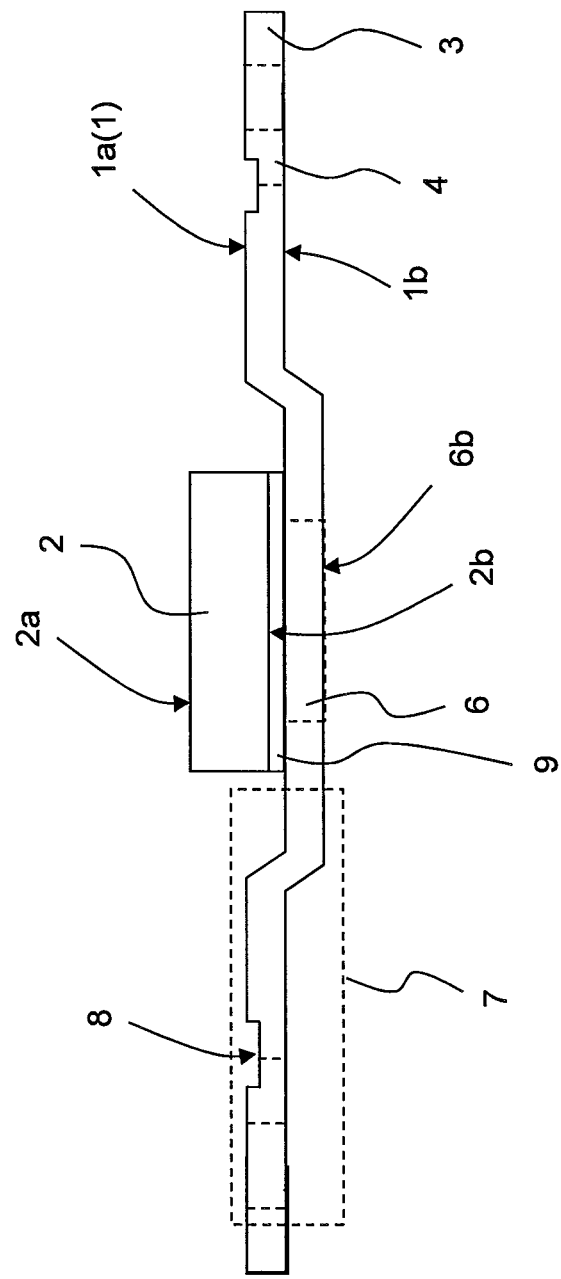
FIG. 6 is a sectional view showing a cross section of the lead frame of FIG. 4 taken along the line D-D'.
Figure 7:
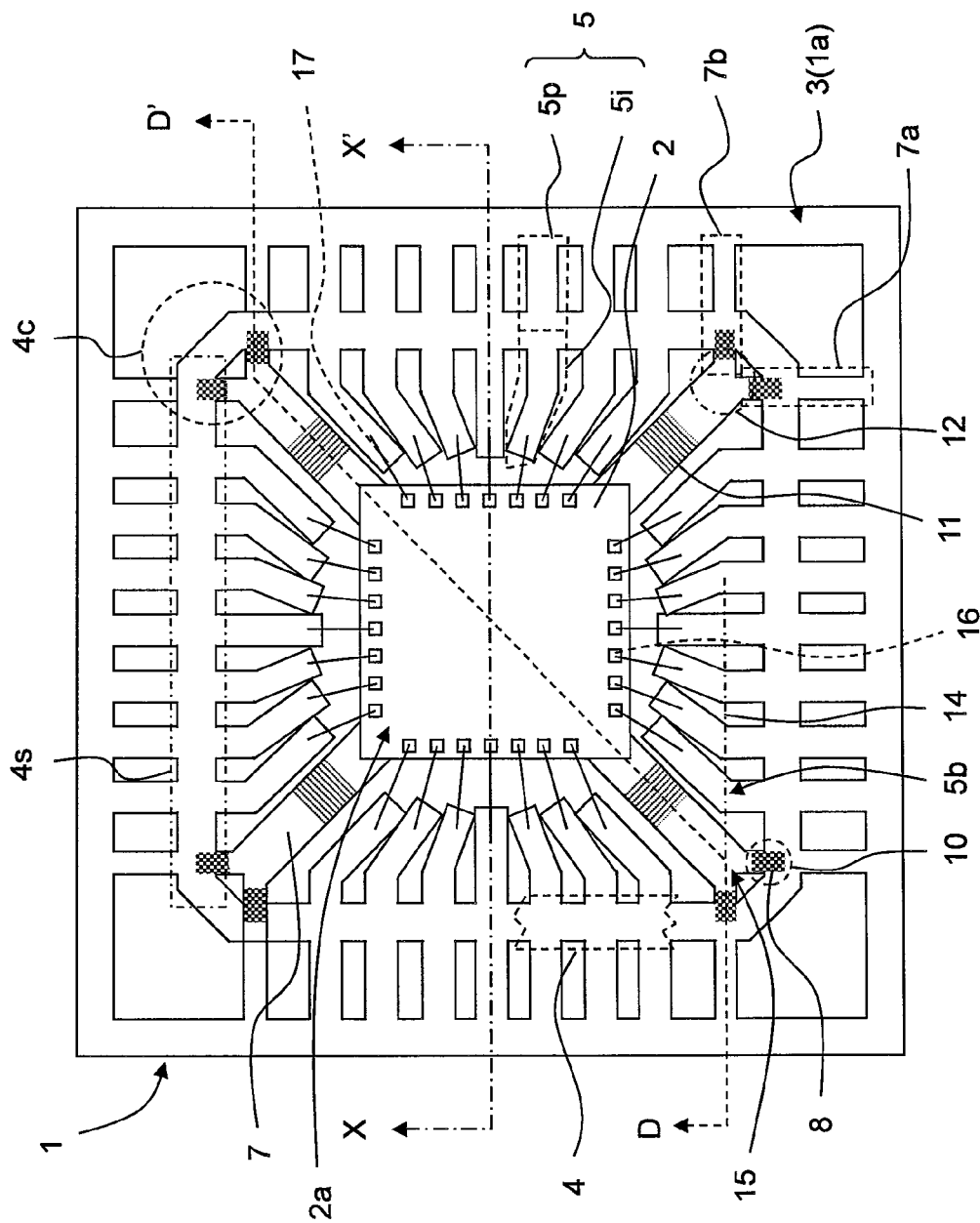
FIG. 7 is a top view of the lead frame in the course of an assembly process (at the time of completion of a wire bonding step) for explaining the first half of the assembly process (to the wire bonding) in the method of manufacturing a semiconductor device according to one embodiment hereof.
Figure 8:
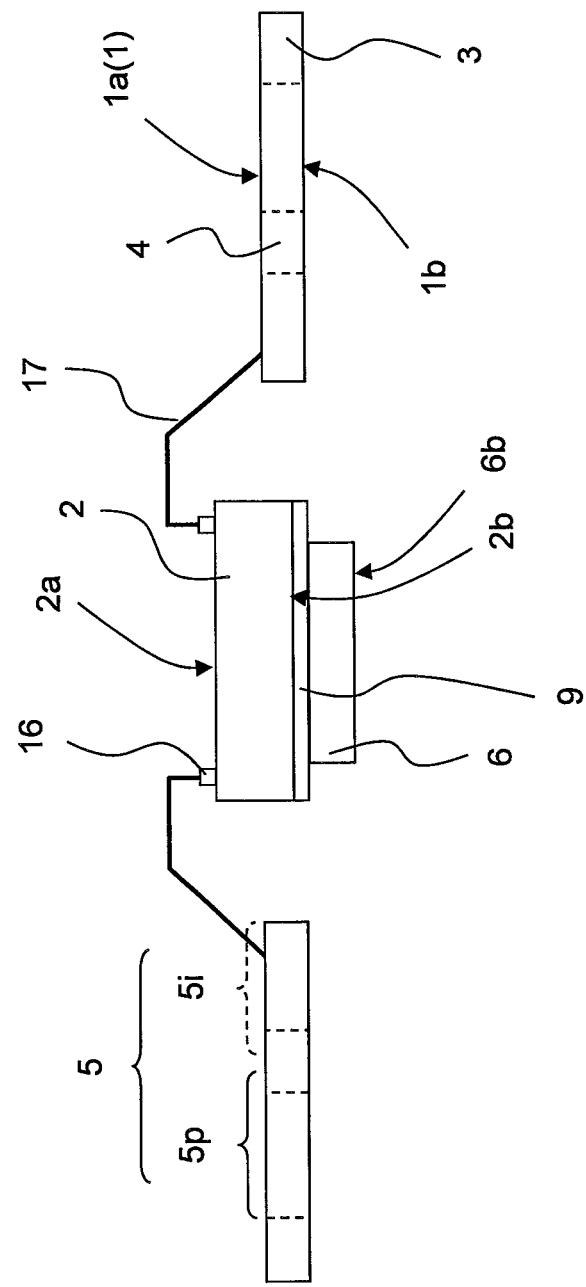
FIG. 8 is a sectional view showing a cross section of the lead frame of FIG. 7 taken along the line X-X'.
Figure 9:
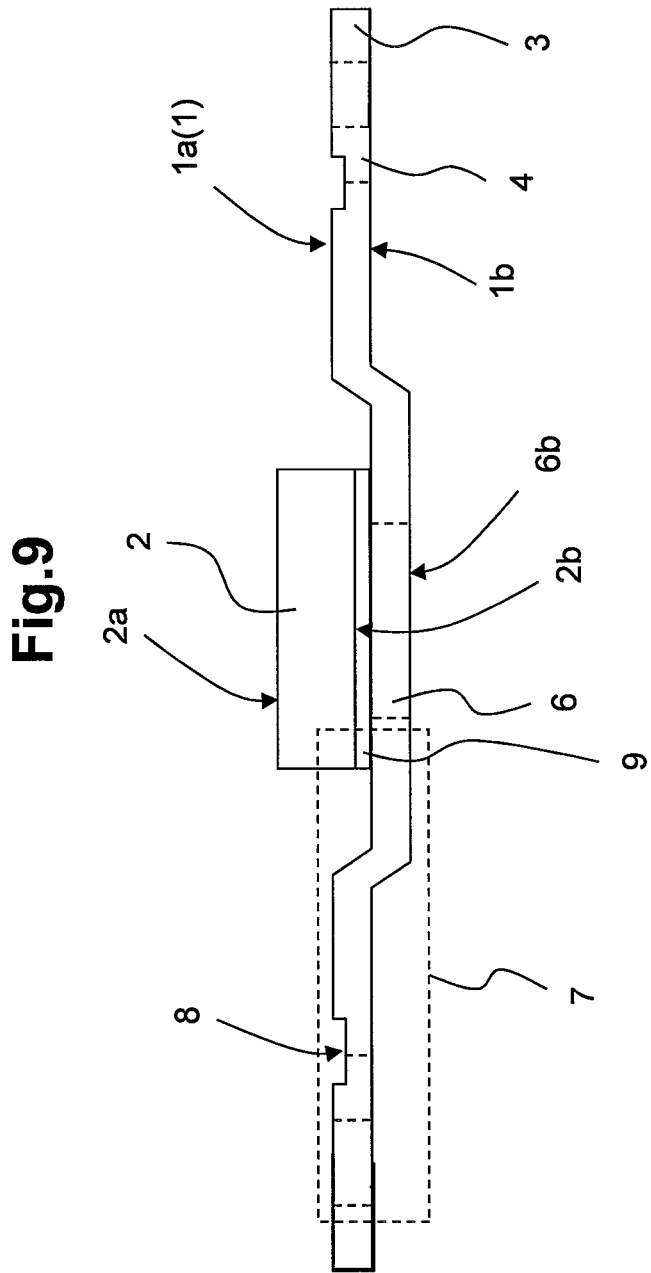
FIG. 9 is a sectional view showing a cross section of the lead frame of FIG. 7 taken along the line D-D'.

FIG. 1 is a top view of a lead frame in the course of an assembly process (at the time of completion of a lead frame preparation step) for explaining the first half of the assembly process (to the wire bonding) in a method of manufacturing a semiconductor device according to one embodiment hereof. FIG. 2 is a sectional view showing a cross section of the lead frame of FIG. 1 taken along the line X-X'. FIG. 3 is a sectional view showing a cross section of the lead frame of FIG. 1 taken along the line D-D'. FIG. 4 is a top view of a lead frame in the course of the assembly process (at the time of completion of a die bonding step) for explaining the first half of the assembly process(to the wire bonding) in the method of manufacturing a semiconductor device according to one embodiment hereof. FIG. 5 is a sectional view showing a cross section of the lead frame of FIG. 4 taken along the line X-X'. FIG. 6 is a sectional view showing a cross section of the lead frame of FIG. 4 taken along the line D-D'. FIG. 7 is a top view of the lead frame in the course of the assembly process (at the time of completion of a wire bonding step) for explaining the first half of the assembly process (to the wire bonding) in the method of manufacturing a semiconductor device according to one embodiment hereof. FIG. 8 is a sectional view showing a cross section of the lead frame of FIG. 7 taken along the line X-X'. FIG. 9 is a sectional view showing a cross section of the lead frame of FIG. 7 taken along the line D-D'. The first half of the assembly process(to the wire bonding) in the method of manufacturing a semiconductor device according to one embodiment hereof will be described with reference to the drawings.

First, the lead frame 1 (or its unit device region) used for assembly will be described with reference to FIG. 1. As shown in FIG. 1, the peripheral portion of the lead frame 1 makes a substantially rectangular frame-like (e.g. substantially square) frame part 3. A substantially rectangular frame-like tie-bar 4 is formed inside from the frame part. In a center part located substantially at the center when viewed from the positions of the frame part 3 and the tie-bar 4, a die pad 6 is formed, which is a so-called "small-area die pad", and stays in a locational relation such that with a semiconductor chip 2 mounted on a first principal face 6a of the die pad 6, the die pad 6 is involved in the semiconductor chip 2 in plane view.

The die pad 6 is joined to the frame part 3 and the tie-bar 4 (corner parts 4c of the tie-bar) through e.g. four die-pad-support leads 7 and supported thereby. In this embodiment, each die-pad-support lead 7 has an outer end portion which branches, in a branch part 12, into a first branch 7a and a second branch 7b, which are referred to as "branch" collectively.

Each die-pad-support lead 7 has a down-set part 11 formed inside from the branch part 12. In a joint part 10 of the branches 7a and 7b joined with the tie-bar 4, a concaved part 8 is formed by e.g. etching on the side of the first principal face 6a of the die pad 6 (on the side of the first principal face 1a of the lead frame), namely on the side of the first principal face 1a of the die-pad-support lead 7. While the concaved part 8 is formed by etching after the patterning of the lead frame in this embodiment, the timing of the etching may coincide with or precede the timing of the patterning of the lead frame. The method of forming the concaved part 8 may be mechanical means in addition to etching. However, the etching is more advantageous in that other portions of the die-pad-support lead 7 are not subjected to deformation or the like, and a high machining precision can be achieved.

To each of the four side 4s of the tie-bar 4, a plurality of leads 5 are joined. Each lead has an outer lead part 5p which extends outwardly and is joined to and supported by e.g. the frame part 3, and an inner lead part 5i which extends inwardly. Here, one plane which is in parallel with the principal face of the lead frame, and close to the principal face of the die pad and the principal face of the lead frame other than the die pad can be defined as "a plane which the lead frame substantially belongs to". In this embodiment, some of the inner lead parts 5i each have a bend part 5b which is bent in the plane which the lead frame substantially belongs to. In addition, the intersection point 15 of a straight line 14 which runs through the bent part 5b of the inner lead part 5i adjacent to the die-pad-support lead 7 in parallel with the side 4s of the tie-bar 4 which the lead belongs to, and the die-pad-support lead 7 (exactly, the intersection point of the straight line 14 and the center line of the die-pad-support lead 7) can be defined. Now, turning to the two-dimensional locational relation between the intersection point 15 and the concaved part 8 on the branch adjacent to the inner lead part 5i, the concaved part 8 is formed outward from the intersection point 15 in this embodiment.

Now, examples of primary dimensions of the lead frame 1 according to this embodiment will be noted. The following are preferred: the thickness of the lead frame is e.g. about 125 micrometers; the diameter of the die pad is e.g. about 3 millimeters; the pitch of the outer lead is e.g. about 400 micrometers; the width of the tie-bar is e.g. about 150 micrometers; and the quantity of the down setting is e.g. about 240 micrometers. The preferred examples of the depth, length and width of the concaved part 8 are about 20 to about 30 micrometers, about 300 micrometers, and about 150 micrometers, respectively. Herein, the branches 7a and 7b of the die-pad-support lead 7 have a width of e.g. about 150 micrometers. As the material of the lead frame, a copper-based alloy which includes copper as a primary component is used usually. Specific examples of the copper-based alloy include a Cu—Fe-based alloy, a Cu—Cr—Sn—Zn-based alloy, and a Cu—Zr-based alloy.

Next, a cross section of the lead frame of FIG. 1 taken along the line X-X' is shown in FIG. 2. As shown in the drawing, the upper face 6a (i.e. the chip-mount side, which is located opposite to the second principal face 6b) of the die pad 6 is arranged by the down setting to be somewhat lower in height than another part of the lead frame 1 (e.g. the upper face 1a of the tie-bar 4).

Next, a cross section of the lead frame of FIG. 1 taken along the line D-D' is shown in FIG. 3. As shown in the drawing, the upper face (chip-mount side) 6a of the die pad 6 is arranged by the down setting to be somewhat lower in height than another part of the lead frame 1 (e.g. the upper face 1a of the die-pad-support lead 7 located outward from the down-set part 11) as in the above-described case.

Next, the die bonding is performed on the upper face 6a of the die pad 6 via an adhesive-member layer 9 of e.g. silver paste so that the upper face 2a of a semiconductor chip 2 (a face opposite to the rear face 2b), namely a face where the chip has a plurality of bonding pads 16 formed is arranged upward as shown in FIGS. 4, 5 and 6.

Next, bonding wires 17, e.g. gold wires are used to connect between the bonding pads 16 and inner ends of corresponding leads 5, i.e. inner ends of the inner lead parts 5i, as shown in FIGS. 7, 8 and 9.

Then, a mold process will be executed.

2. Description of an important part (sealing process) of the assembly process in the method of manufacturing a semiconductor device according to one embodiment hereof (See FIGS. 10 to 17, chiefly.)

The sealing method to be described in this section is premised on the transfer mold. However, it is obvious that the sealing method may be based on another resin sealing method such as compression mold.

Figure 10:
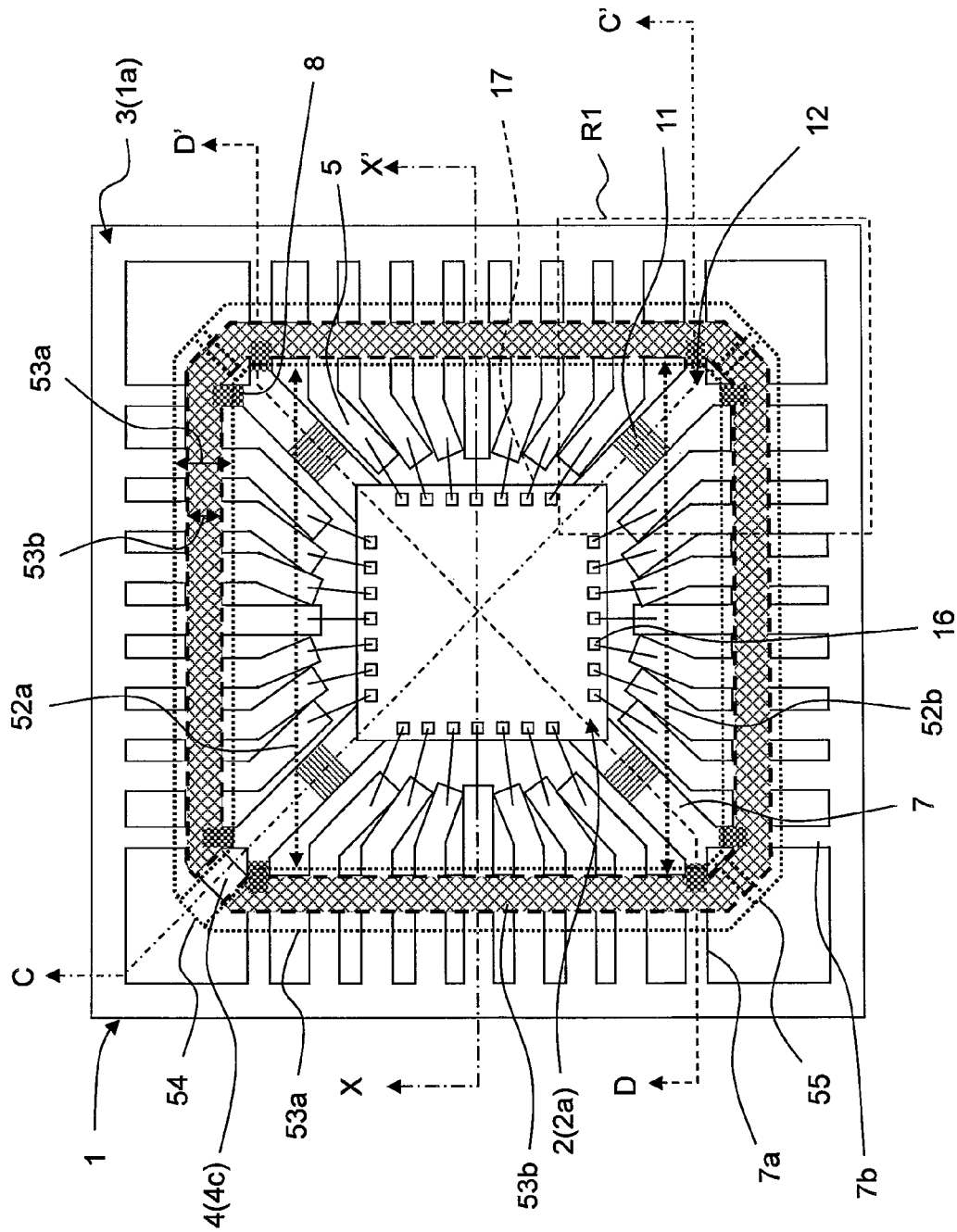
FIG. 10 is a top view of the lead frame in the course of the assembly process (in a clamping step of the lead frame) for explaining an important part (sealing process) of the assembly process in the method of manufacturing a semiconductor device according to one embodiment hereof.
Figure 11:
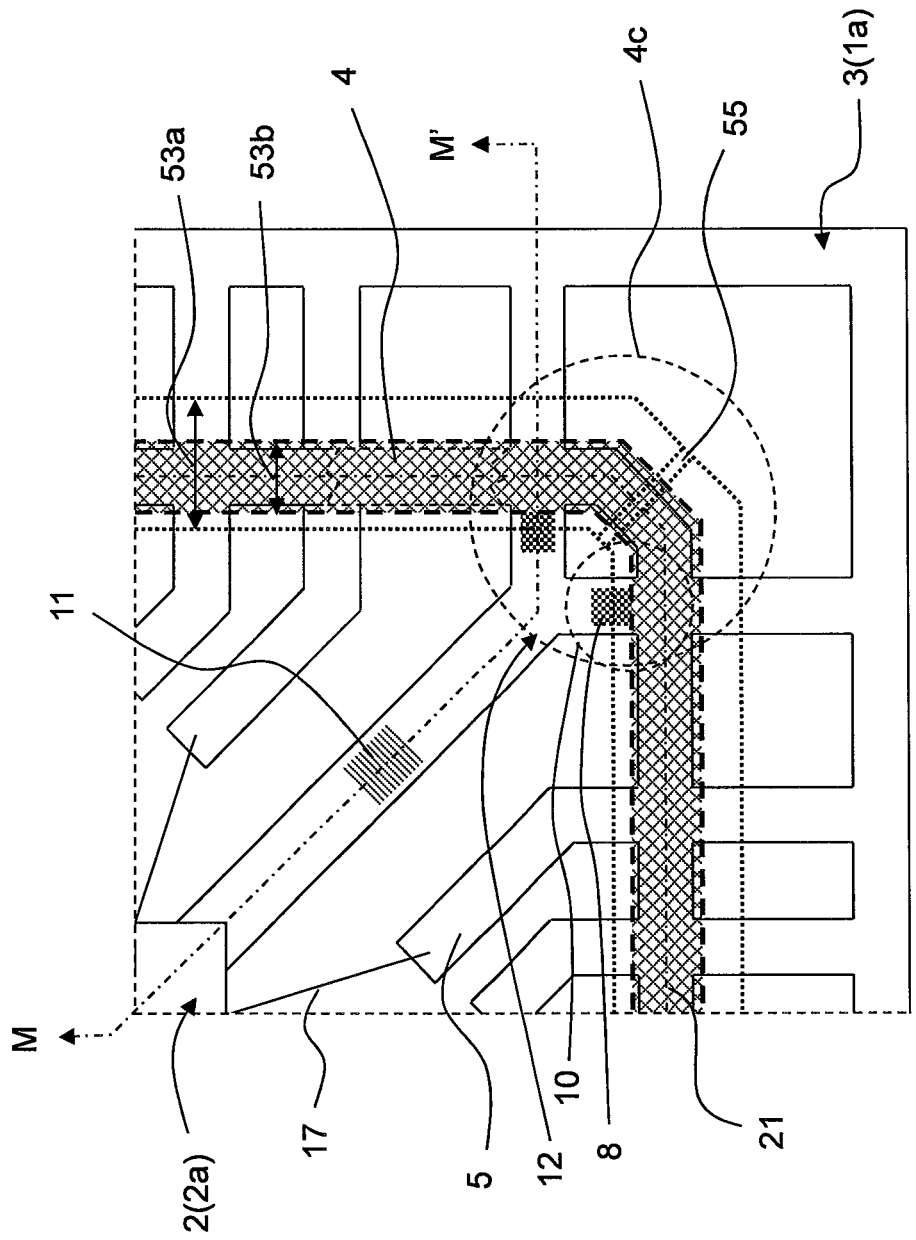
FIG. 11 is an enlarged top view showing a cut-out region R1 of the corner part of the lead frame of FIG. 10.
Figure 12:
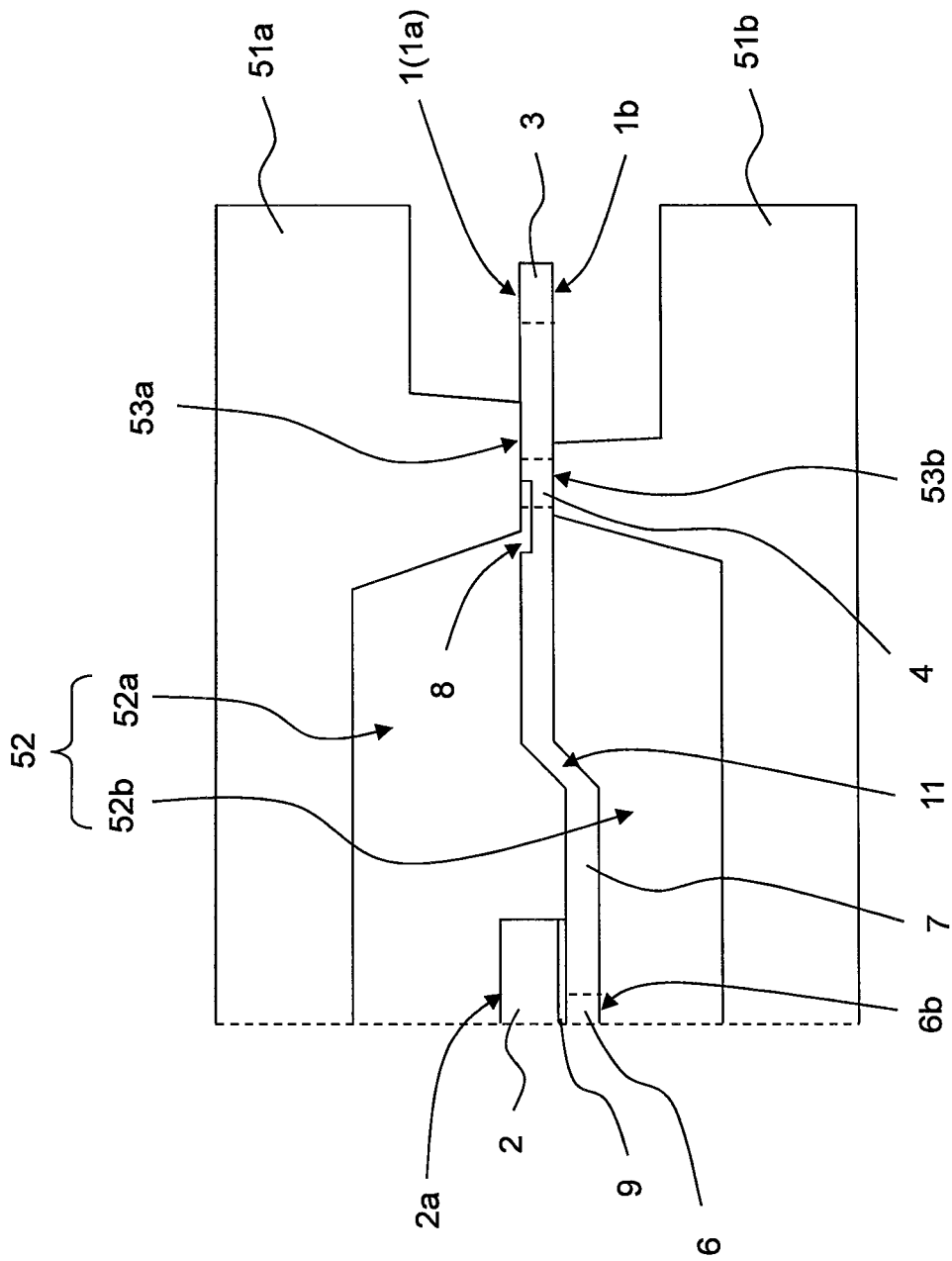
FIG. 12 is a schematic sectional view taken along the line M-M' of FIG. 11 (in the clamping step of the lead frame)
Figure 13:
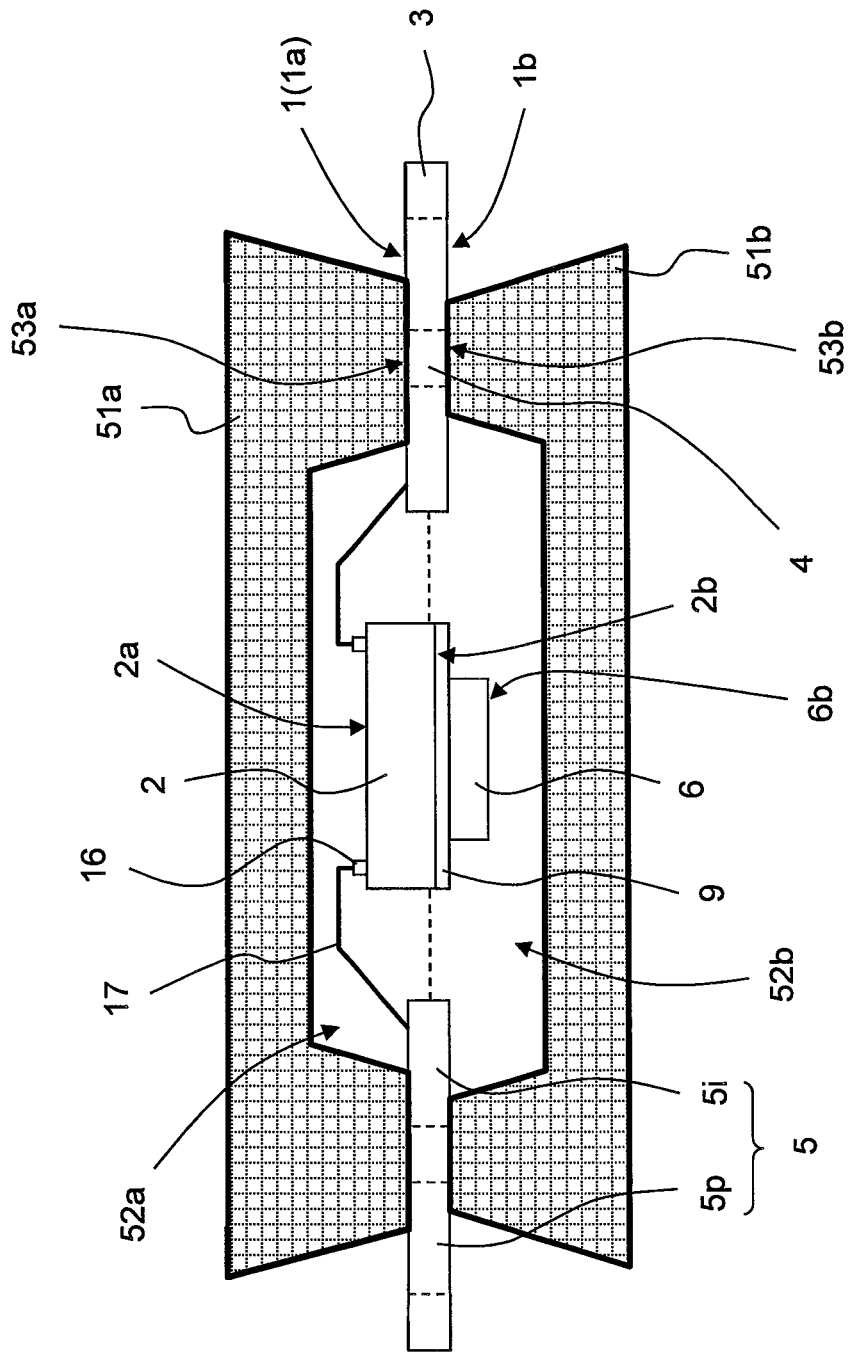
FIG. 13 is a schematic sectional view showing a cross section taken along the line X-X' of FIG. 10 (in the clamping step of the lead frame)
Figure 14:
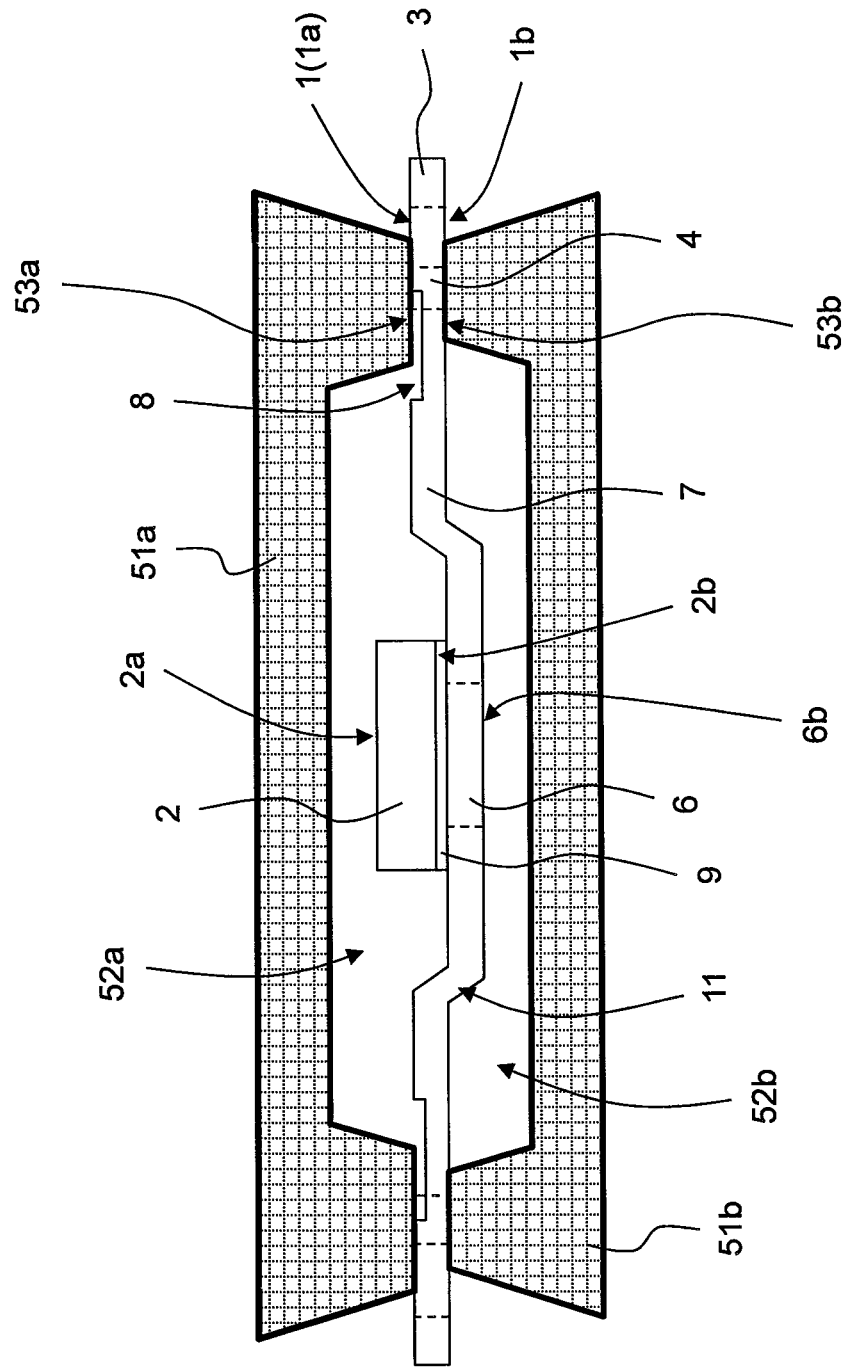
FIG. 14 is a schematic sectional view showing a cross section taken along the line D-D' of FIG. 10 (in the clamping step of the lead frame)
Figure 15:
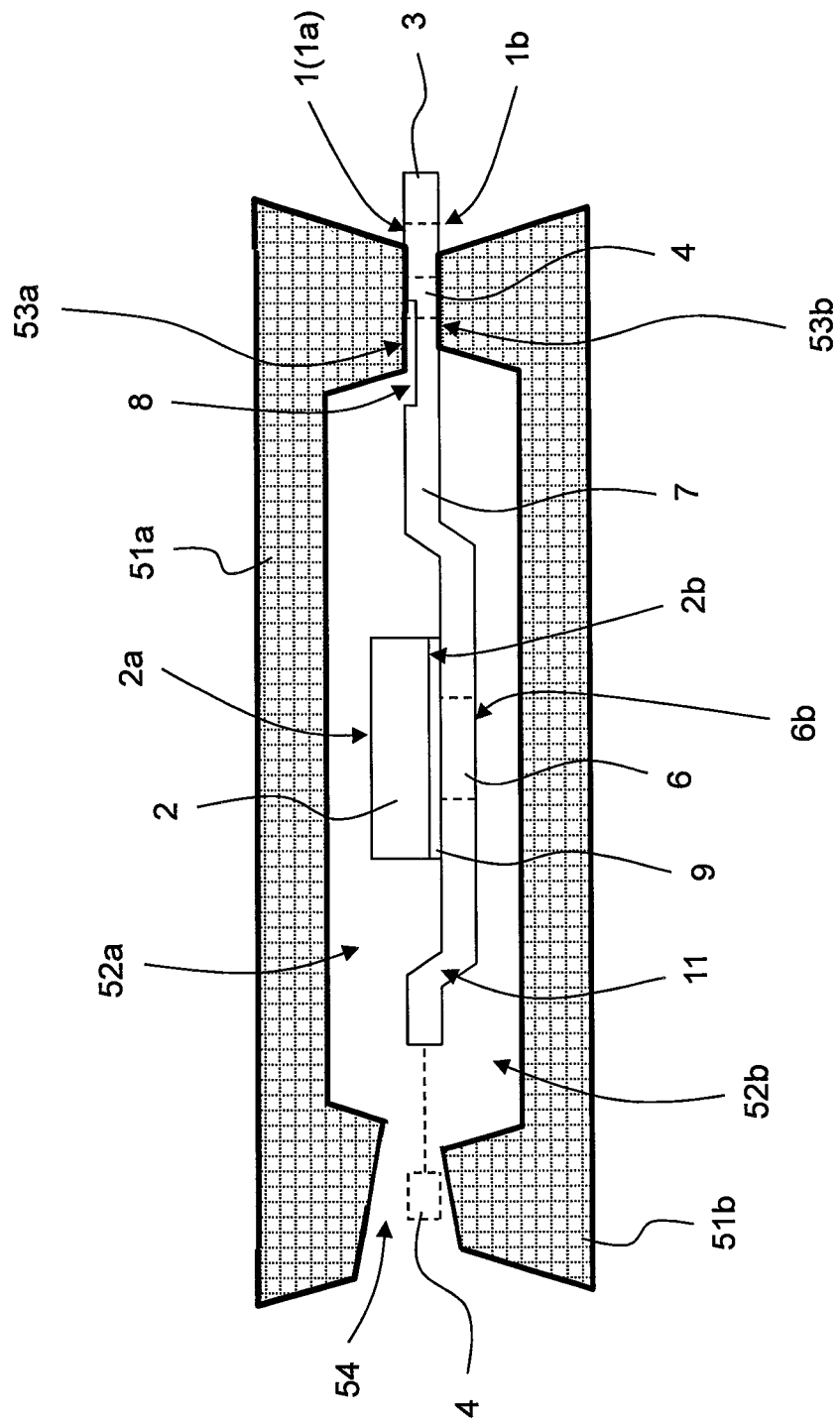
FIG. 15 is a schematic sectional view showing a cross section taken along the line C-C' of FIG. 10 (in the clamping step of the lead frame)
Figure 16:
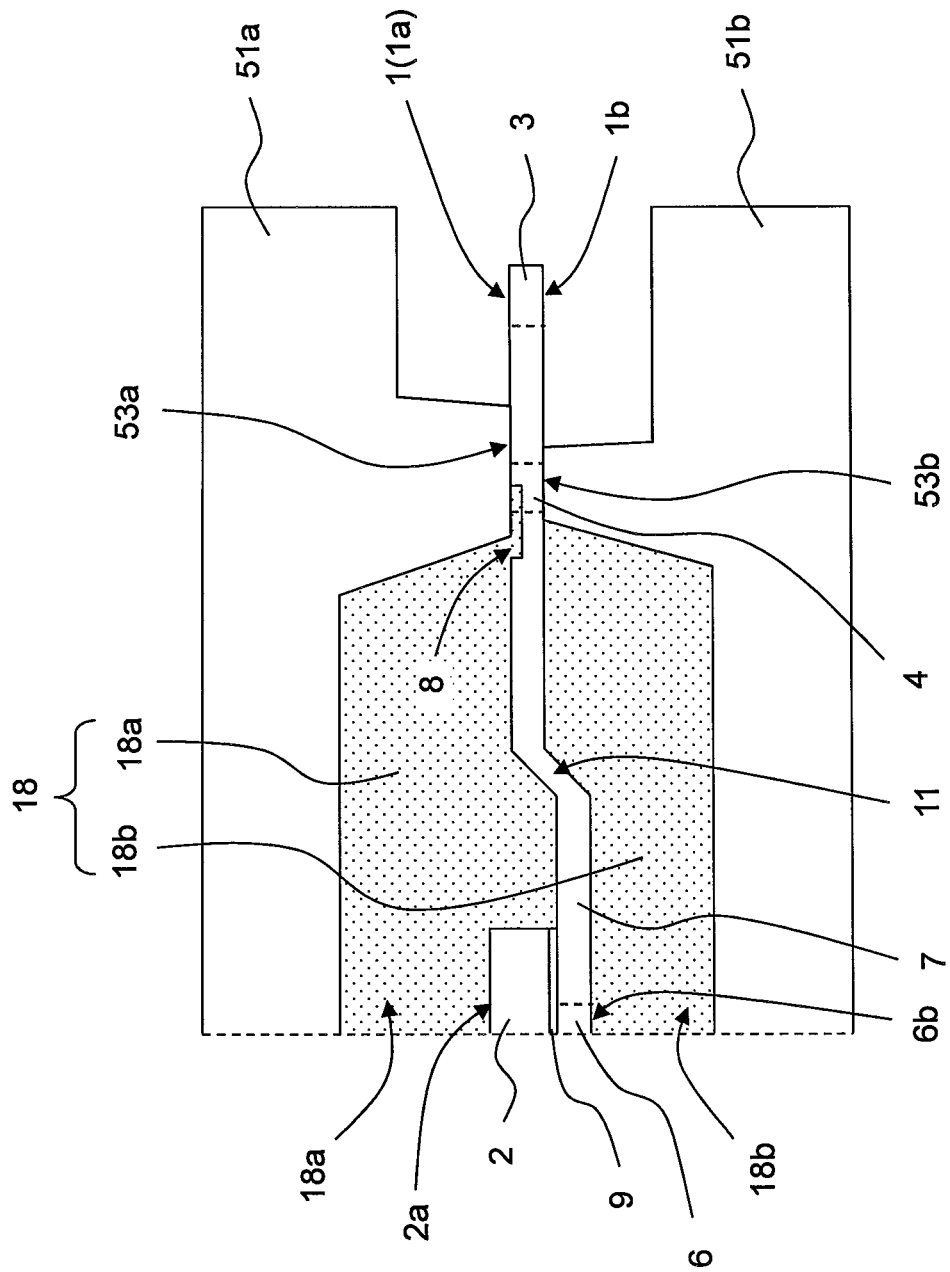
FIG. 16 is a schematic sectional view taken along the line M-M' of FIG. 11 (in the resin sealing step)
Figure 17:
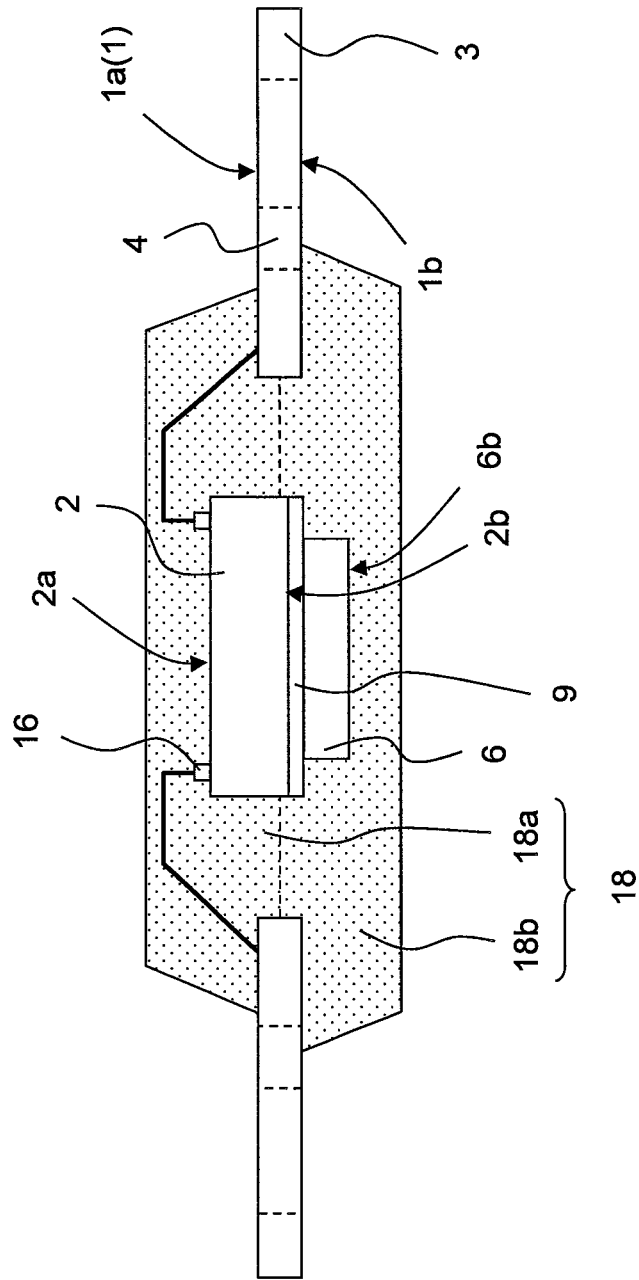
FIG. 17 is a schematic sectional view showing a cross section taken along the line X-X' of FIG. 10 (at the time of completion of the resin sealing step)

FIG. 10 is a top view of the lead frame in the course of an assembly process (in the clamping step of the lead frame) for explaining an important part (sealing process) of the assembly process in the method of manufacturing a semiconductor device according to one embodiment hereof. FIG. 11 is an enlarged top view showing a cut-out region R1 of the corner part of the lead frame of FIG. 10. FIG. 12 is a schematic sectional view taken along the line M-M' of FIG. 11 (in the clamping step of the lead frame). FIG. 13 is a schematic sectional view showing a cross section taken along the line X-X' of FIG. 10 (in the clamping step of the lead frame). FIG. 14 is a schematic sectional view showing a cross section taken along the line D-D' of FIG. 10 (in the clamping step of the lead frame). FIG. 15 is a schematic sectional view showing a cross section taken along the line C-C' of FIG. 10 (in the clamping step of the lead frame). FIG. 16 is a schematic sectional view taken along the line M-M' of FIG. 11 (in the resin sealing step). FIG. 17 is a schematic sectional view showing a cross section taken along the line X-X' of FIG. 10 (at the time of completion of the resin sealing step). With reference to these drawings, an important part (sealing process) of the assembly process in the method of manufacturing a semiconductor device according to the embodiment hereof will be described.

As shown in FIG. 7, the lead frame 1 after the completion of the wire bonding is set between and clamped by molding dies (consisting of an upper die and a lower die). FIG. 10 presents a plane view when viewing, from above the upper die, the upper face of the lead frame 1 held clamped in the perspective manner. As shown in FIG. 10, almost all the regions of the tie-bar 4 are clamped by the clamp face 53a of the upper die (first molding die) and the clamp face 53b of the lower die (second molding die). Describing the locational relation of the upper and lower dies in a widthwise direction of the tie-bar 4, the clamp face 53b of the lower die is substantially included in a range that the clamp face 53a of the upper die occupies in plane view. Further, describing the locational relation of the upper and lower dies in connection with the upper cavity 52a (first cavity) and the lower cavity 52b (second cavity), the upper cavity 52a is substantially included in a range that the lower cavity 52b occupies in plane view. In other words, it is cited as an example that the outer edge of the upper cavity 52a is located inside the outer edge of the lower cavity 52b by e.g. about 25 micrometers over the entire periphery thereof. In such arrangement, one of upper and lower dies is made larger than the other to provide a clearance so that no trouble is caused even if the upper or lower die is put out of position horizontally.

Incidentally, if such displacement results in no trouble, it is not necessary to make such arrangement. That is, both the upper and lower dies may be identical in size with each other. In addition, any of the upper and lower dies may be increased in size.

In a portion in each clamp face 53a, 53b corresponding to each corner part, e.g. one gate part 54 and three air vent parts 55 are formed.

Now, FIG. 11 presents an enlarged view of a cut-out region R1 of the corner part of the lead frame of FIG. 10. As shown in the drawing, in this embodiment, the concaved part 8 formed in each joint part 10 of each corner part 4c of the tie-bar 4, i.e. each joint part 10 of (the branches 7a and 7b of) the die-pad-support lead 7 with the tie-bar 4 is arranged as described below. Each concaved part 8 is formed to extend outward from the branch part 12 of the first and second branches 7a and 7b to a depth of one half of the width inside the tie-bar 4 belonging to the joint part 10 along a direction of the width of the tie-bar. The preferred range of the concaved part 8 where the concaved part extends ranges e.g. from a location in the vicinity of the inner end of the clamp face 53a of the upper die and inside from the inner end to the widthwise center of the part of the tie-bar 4 (i.e. on the inside of the center line 21 of the tie-bar 4) generally.

Next, a cross section of the part of the lead frame of FIG. 11 taken along the line M-M' is shown in FIG. 12. As shown in the drawing, the tie-bar 4 and the die-pad-support lead 7 are clamped by the upper and lower dies 51a and 51b (which are referred to as "die 51" collectively) put in contact with the upper and lower faces 1a and 1b of the lead 7 close to the tie-bar. In this embodiment, in a certain part of the concaved part 8, the upper die 51a is out of contact with the upper face 1a of the lead frame 1, and therefore the clamp pressure is not concentrated on this part. A preferred example of a quantity of overdrive, namely a quantity by which the die crushes the lead frame in the clamping is about 10 micrometers. Specifically, it means that the thickness of the lead frame initially having a thickness of e.g. about 125 micrometers is made about 115 micrometers in the area where the lead frame is clamped. Now, it is noted that typically during a period of time when the mold process is executed (from the time of setting the lead frame to the removal thereof), the parts, such as the upper and lower dies, which are brought into contact with the lead frame and the sealing resin are heated and kept at about 175 degrees centigrade.

Subsequently, what was described above is described with reference to the whole cross section of the die of FIGS. 13, 14 and 15. FIG. 13 shows a cross section taken along the line X-X' of FIG. 10. As shown in FIG. 13, the upper face 1a of the lead frame 1 is in contact with the clamp face 53a of the upper die over the entire width of the clamp face 53a, and the lower face 1b of the lead frame 1 is in contact with the clamp face 53b of the lower die over the entire width of the clamp face 53b.

FIG. 14 shows a cross section taken along the line D-D' of FIG. 10. As shown in FIG. 14, the lower face 1b of the lead frame 1 is in contact with the clamp face 53b of the lower die over the entire width of the clamp face 53b as in FIG. 12, and the upper face 1a of the lead frame 1 is in contact with the clamp face 53a of the upper die over the entire width of the clamp face 53a except apart corresponding to where the concaved part 8 is formed. In the part where the concaved part 8 is formed, the clamp face 53a of the upper die is out of contact with the upper face 1a of the lead frame 1.

FIG. 15 shows a cross section taken along the line C-C' of FIG. 10. As shown in FIG. 15, on the right side of the upper and lower dies 51a and 51b as in FIG. 14, the lower face 1b of the lead frame 1 is in contact with the clamp face 53b of the lower die over the entire width of the clamp face, and the upper face 1a of the lead frame 1 is in contact with the clamp face 53a of the upper die over the entire width of the clamp face 53a except a part corresponding to where the concaved part 8 is formed. In the part where the concaved part 8 is formed, the clamp face 53a of the upper die is out of contact with the upper face 1a of the lead frame 1. In contrast, on the left side of the upper and lower dies 51a and 51b, the gate part 54 is formed and as such, the lead frame 1 is not clamped for any face thereof in this part.

Next, the sealing resin is charged through the gate part 54 (FIG. 15) into the cavity 52 (FIG. 12) e.g. by the transfer mold, whereby a resin-sealed body 18 including an upper resin-sealed body 18a (first resin-sealed body), and a lower resin-sealed body 18b (second resin-sealed body) is formed, as shown in FIG. 16.

Taking out the resin-sealed body 18 from the die 51, a lead frame 1 sealed by the resin can be obtained. Subsequently, a batch baking treatment for cure baking (complete cure) or the like is executed (e.g. at 175 degrees centigrade for several hours approximately).

After that, the process of cutting the tie-bar, etc. is executed.

3. Description of the latter half stage of the assembly process in the method of manufacturing a semiconductor device according to the embodiment hereof (the process of cutting the tie-bar, etc.) (See FIGS. 18 to 25, chiefly.)

In the process described in this section, an unimportant part, namely each corner part of a unit device region of the lead frame (i.e. "each corner part of the lead frame") is cut before the tie-bar is cut off between the leads, for example. It is obvious that the order of the steps is arbitrary, and the step of cutting the tie-bar may be performed precedently.

Figure 18:
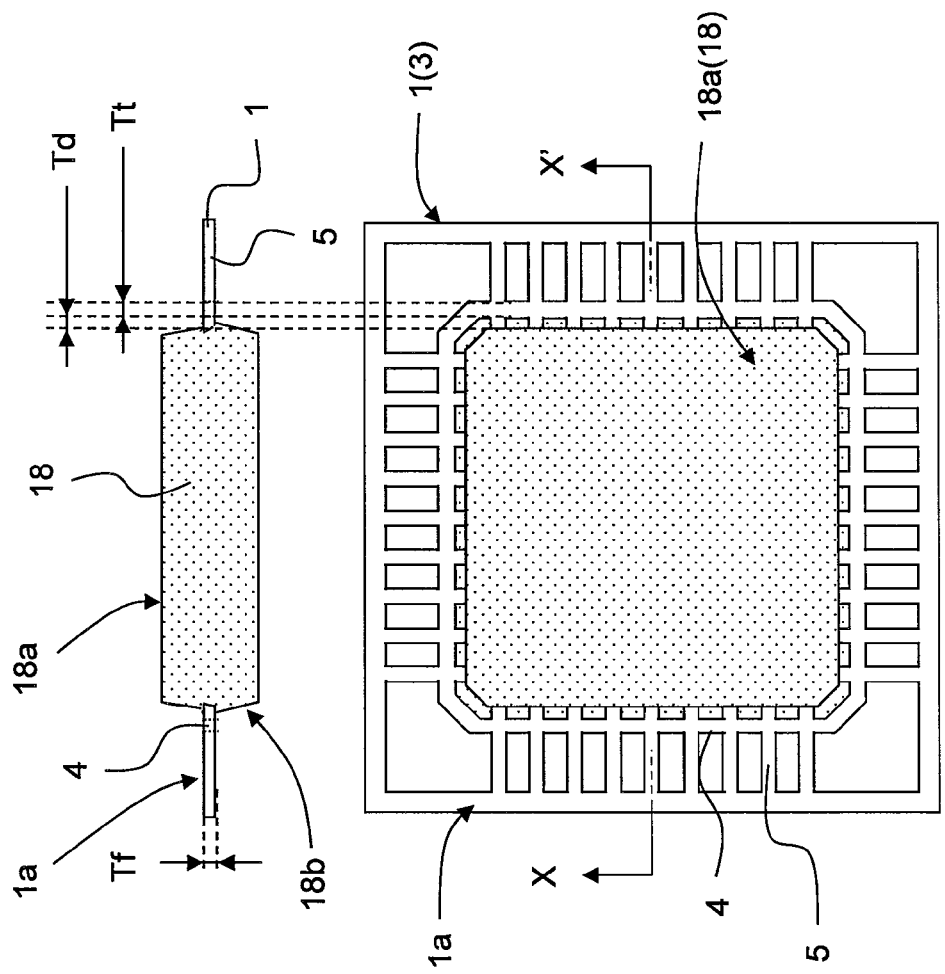
FIG. 18 is a drawing for explaining the latter half stage of the assembly process (the process of cutting the tie-bar, etc.) in the method of manufacturing a semiconductor device according to the embodiment hereof, which presents a schematic cross section of the lead frame (in a upper portion, provided that the interior structure of the sealed body is not shown) and a top view (in a lower portion) (before the step of cutting the lead frame corner part)
Figure 19:
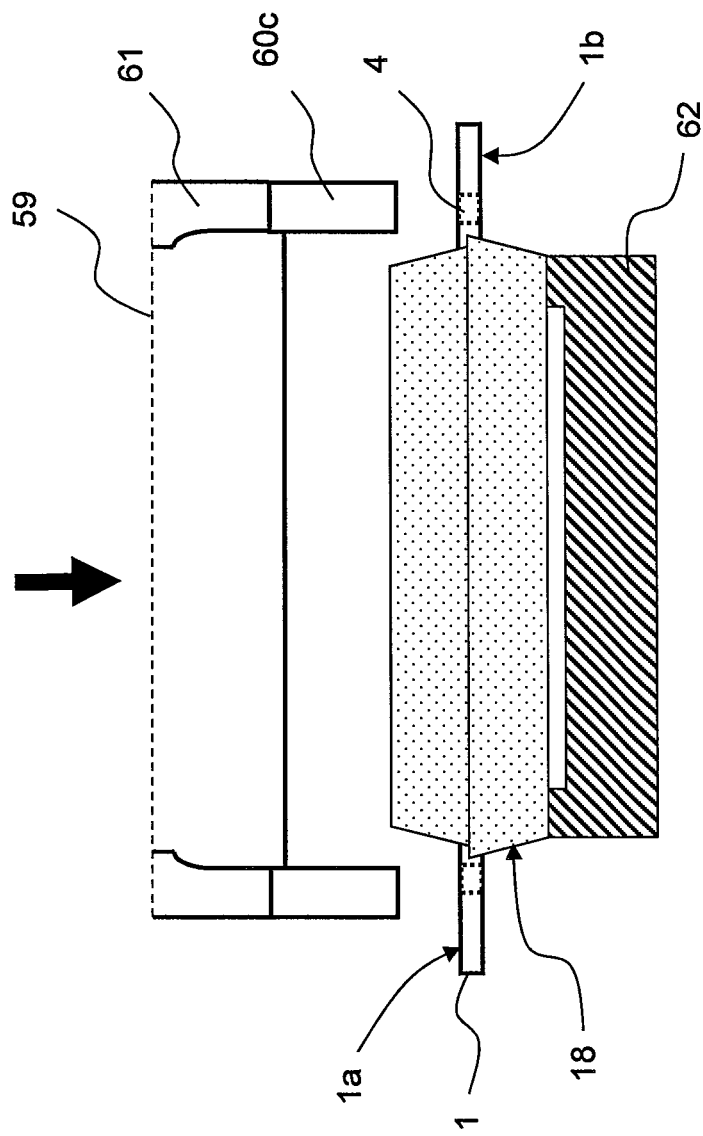
FIG. 19 is a schematic sectional view of a cross section of the lead frame taken along the line X-X' of FIG. 18 and a cutting device (the interior structure of the sealed body is not shown)
Figure 20:
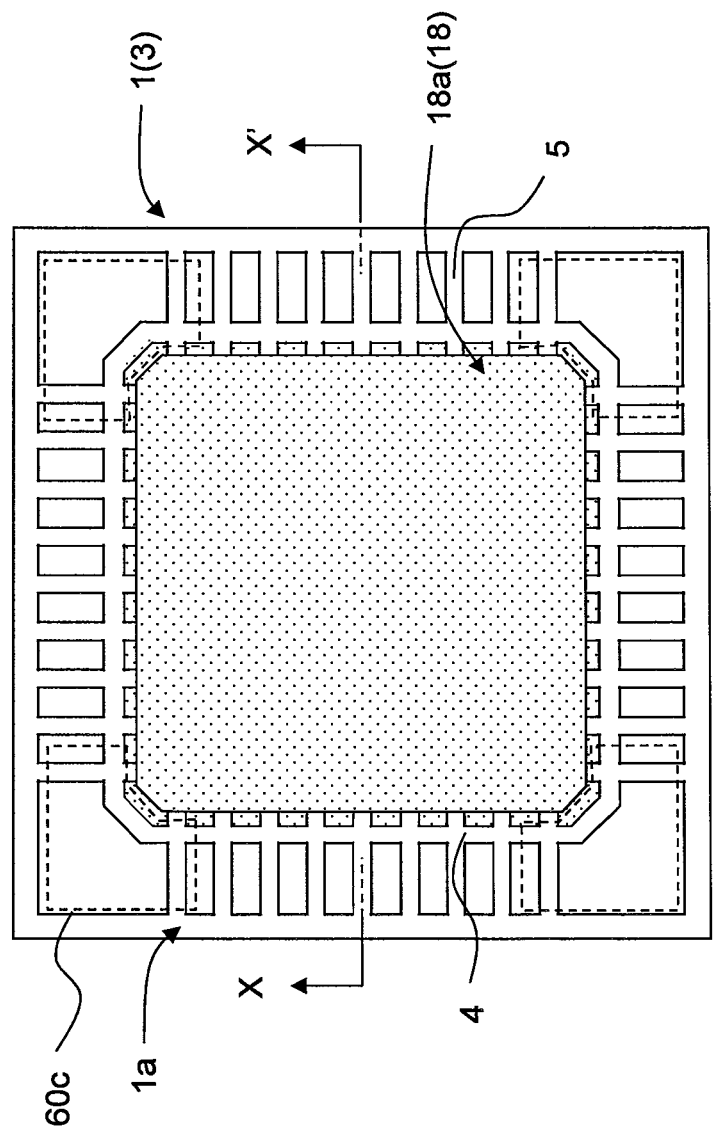
FIG. 20 is a top view of the lead frame (in the step of cutting the lead frame corner part) for explaining the latter half stage of the assembly process (the process of cutting the tie-bar, etc.) in the method of manufacturing a semiconductor device according to the embodiment hereof.
Figure 21:
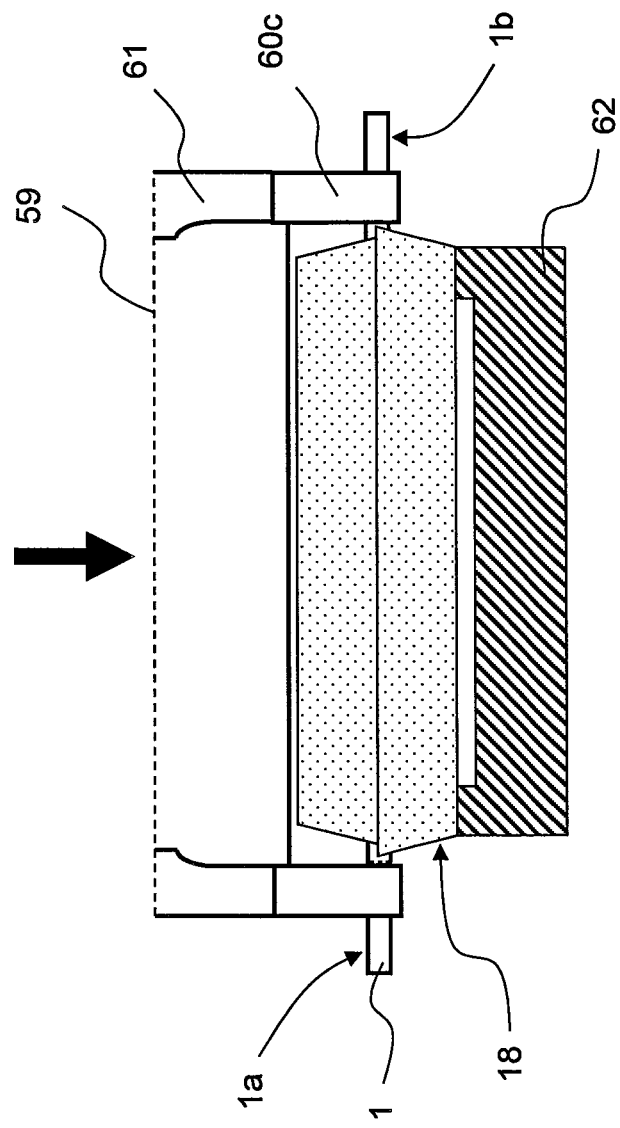
FIG. 21 is a schematic sectional view of a cross section of the lead frame taken along the line X-X' of FIG. 20, and the cutting device (the interior structure of the sealed body is not shown)
Figure 22:
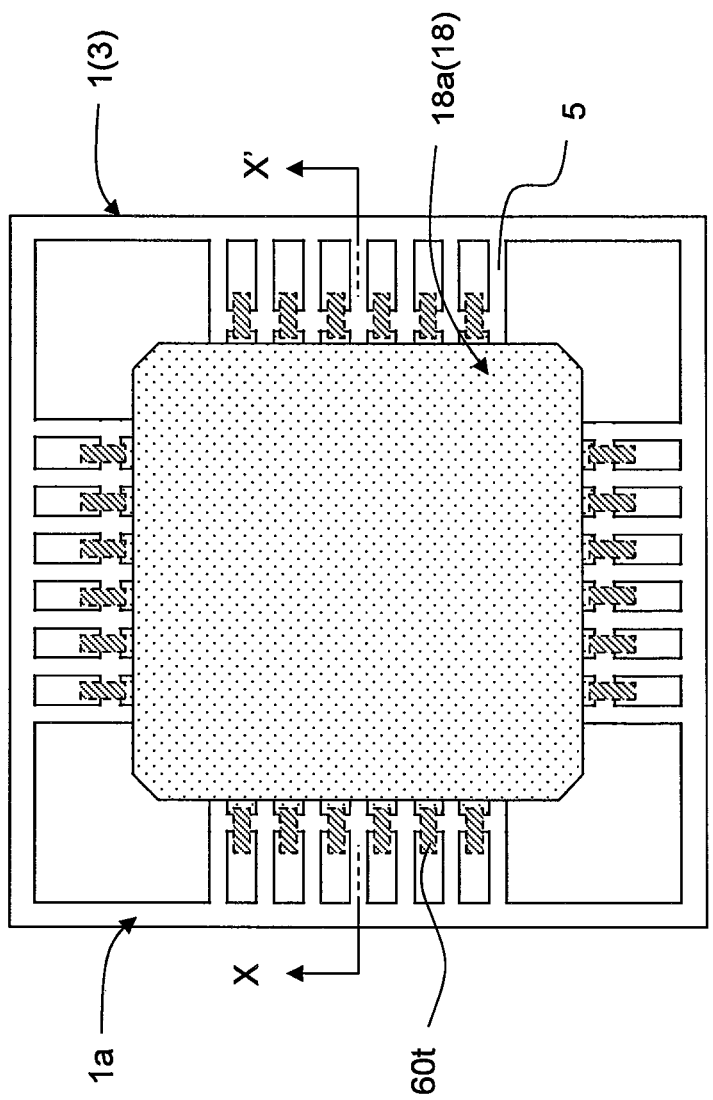
FIG. 22 is a top view of the lead frame (in the step of cutting the tie-bar) for explaining the latter half stage of the assembly process (the process of cutting the tie-bar, etc.) in the method of manufacturing a semiconductor device according to the embodiment hereof.
Figure 23:
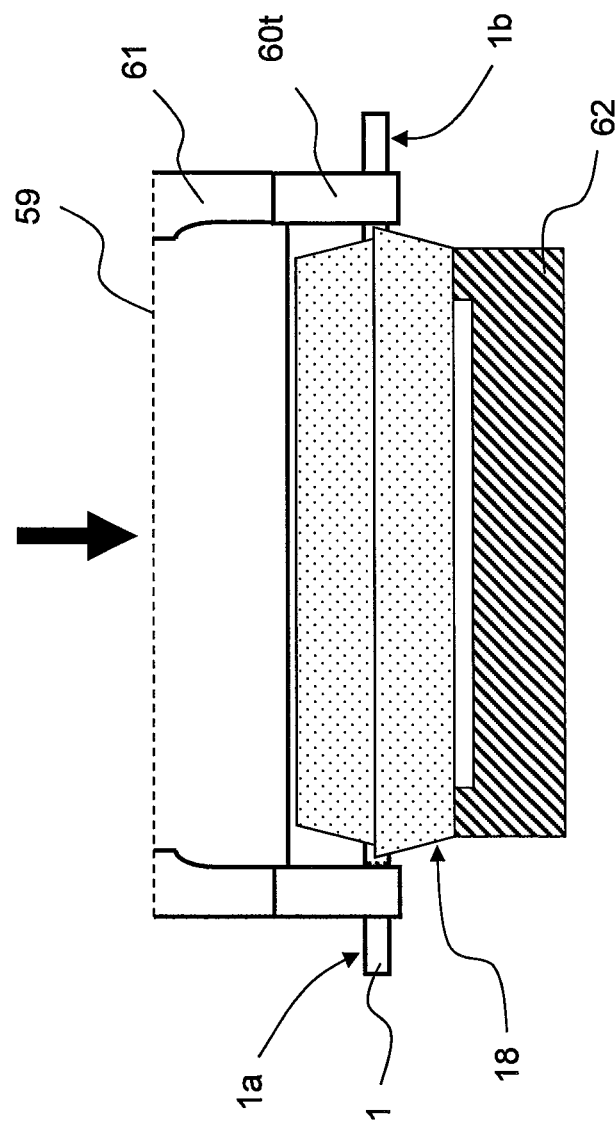
FIG. 23 is a schematic sectional view of a cross section of the lead frame taken along the line X-X' of FIG. 22, and the cutting device (the interior structure of the sealed body is not shown)
Figure 24:
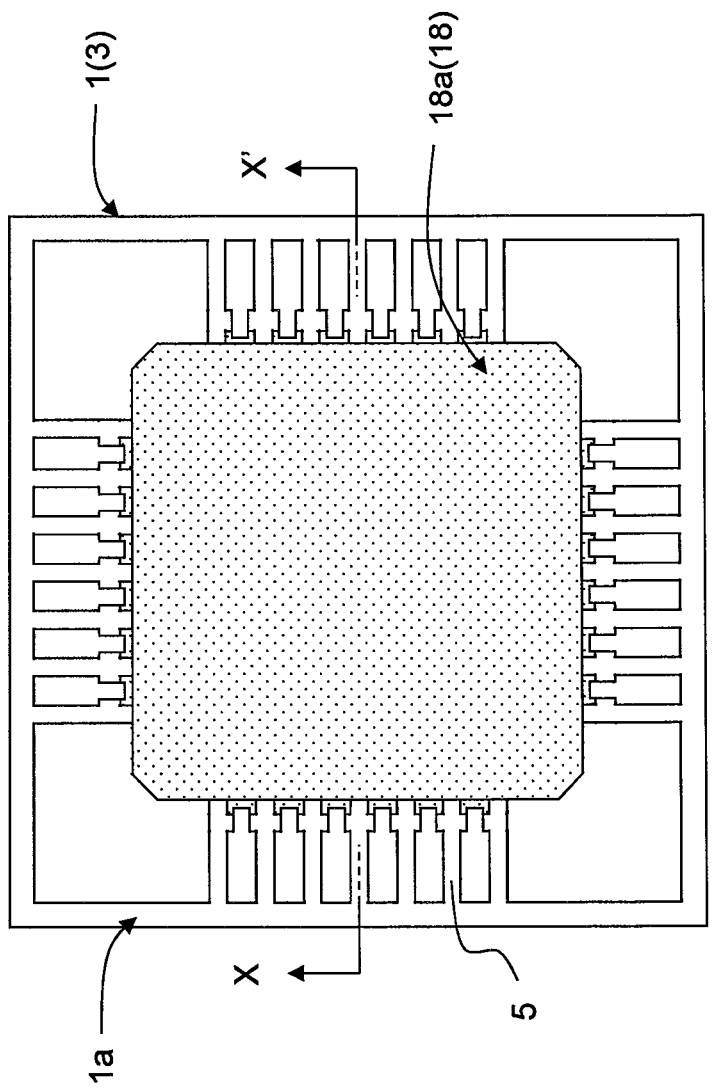
FIG. 24 is a top view of the lead frame (after the step of cutting the tie-bar) for explaining the latter half stage of the assembly process (the process of cutting the tie-bar, etc.) in the method of manufacturing a semiconductor device according to the embodiment hereof.
Figure 25:
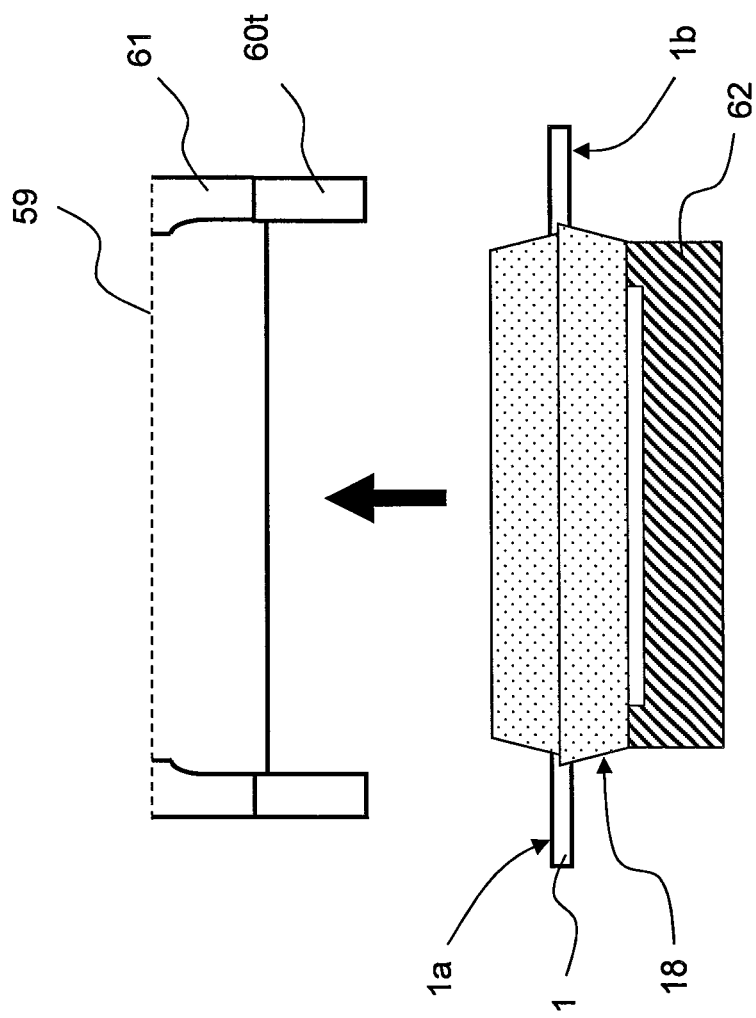
FIG. 25 is a schematic sectional view of a cross section of the lead frame taken along the line X-X' of FIG. 24, and the cutting device (the interior structure of the sealed body is not shown)

FIG. 18 is a drawing for explaining the latter half stage of the assembly process (the process of cutting the tie-bar, etc.) in the method of manufacturing a semiconductor device according to the embodiment hereof, which presents a schematic cross section of the lead frame (in a upper portion, provided that the interior structure of the sealed body is not shown) and a top view (in a lower portion) (before the step of cutting the lead frame corner part). FIG. 19 is a schematic sectional view of a cross section of the lead frame taken along the line X-X' of FIG. 18 and a cutting device (the interior structure of the sealed body is not shown). FIG. 20 is a top view of the lead frame (in the step of cutting the lead frame corner part) for explaining the latter half stage of the assembly process (the process of cutting the tie-bar, etc.) in the method of manufacturing a semiconductor device according to the embodiment hereof. FIG. 21 is a schematic sectional view of a cross section of the lead frame taken along the line X-X' of FIG. 20, and the cutting device (the interior structure of the sealed body is not shown). FIG. 22 is a top view of the lead frame (in the step of cutting the tie-bar) for explaining the latter half stage of the assembly process (the process of cutting the tie-bar, etc.) in the method of manufacturing a semiconductor device according to the embodiment hereof. FIG. 23 is a schematic sectional view of a cross section of the lead frame taken along the line X-X' of FIG. 22, and the cutting device (the interior structure of the sealed body is not shown). FIG. 24 is a top view of the lead frame (after the step of cutting the tie-bar) for explaining the latter half stage of the assembly process (the process of cutting the tie-bar, etc.) in the method of manufacturing a semiconductor device according to the embodiment hereof. FIG. 25 is a schematic sectional view of a cross section of the lead frame taken along the line X-X' of FIG. 24, and the cutting device (the interior structure of the sealed body is not shown). The latter half stage of the assembly process (the process of cutting the tie-bar, etc.) in the method of manufacturing a semiconductor device according to the embodiment hereof will be described with reference to the drawings.

FIG. 18 shows the lead frame 1 after the completion of the resin seal. (The lower portion of the drawing presents a top view, and the upper portion presents a simplified cross section taken along the line X-X'). As shown in FIG. 18, the lead frame 1 includes a lead frame main body, and a resin-sealed body 18 formed in the tie-bar 4. In this embodiment, the upper resin-sealed body 18a (i.e. the first resin-sealed body) is smaller than the lower resin-sealed body 18b (i.e. the second resin-sealed body) according to the difference in size between the upper cavity 52a and the lower cavity 52b.

The concrete examples of the size are as follows. Assuming the lead frame 1 having a thickness Tf of e.g. about 125 micrometers, the width Tt of the tie-bar is e.g. about 150 micrometers, and the space Td between the sealed body and the tie-bar is e.g. about 150 micrometers.

In such condition, the lead frame 1 is put on a package susceptor 62, as shown in FIG. 19. The cutting device having a corner-part-cutting die 60c attached to its cutting-die-holding part 61 is used to cut each lead frame corner part. FIG. 20 is synthesized by superposing the two-dimensional shape presented by the plane view of the corner-part-cutting die 60c at this time on the plane view of the lead frame. Then, the cutting is carried out as shown in FIG. 21. The reason for performing the cutting from the narrower side toward the wider side in terms of the width of the sealed body in this way is to prevent the collision of the cutting die against the side face of the sealed body which causes the deviation of the cutting die. To facilitate doing so, the upper and lower cavities are usually arranged to be different in size as described above. However, if there is no such risk, it is obvious that it is possible to cut the frame in the reverse direction. What was described above applies to the step of cutting the tie-bar as well as the step of cutting the corner part.

Next, the tie-bar is cut by use of the cutting device having the tie-bar cutting die 60t attached to the cutting-die-holding part 61 as shown in FIGS. 22 and 23, and thus the assembly as shown in FIG. 24 is obtained. Then, the cutting device with the tie-bar cutting die 60t attached to the cutting-die-holding part 61 is moved back upward, for example.

After that, the lead shaping process or the like is executed if required.

4. Description of the assembly process final stage (lead-shaping process) in the method of manufacturing a semiconductor device according to the embodiment hereof (See FIGS. 26 to 29, chiefly.)

The lead-shaping method described in this section is just an example, and the lead can take an appropriate shape finally. The lead shaping may be executed on an as-needed basis, and if not required, the step may be skipped.

Figure 26:
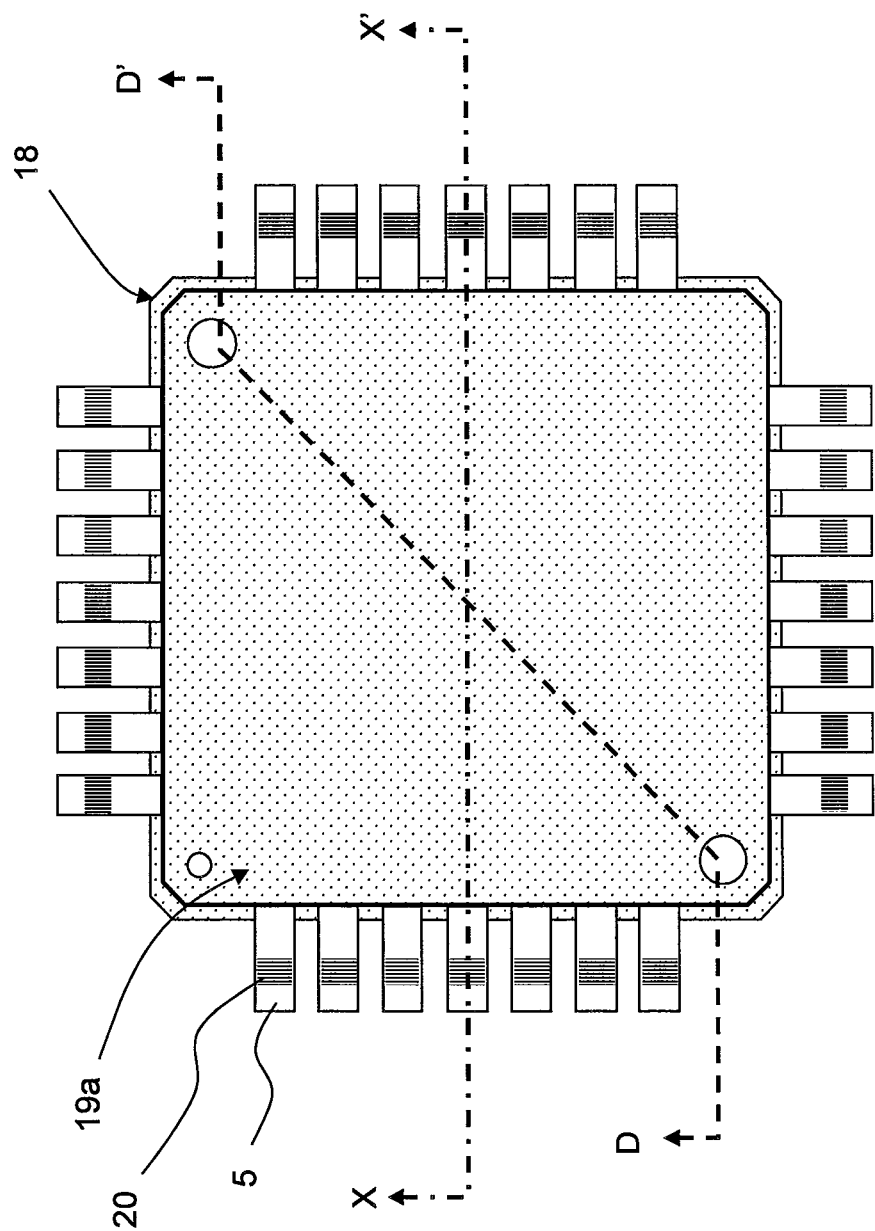
FIG. 26 is a top view of a separated package (sealed body) for explaining the assembly process final stage (lead-shaping process) in the method of manufacturing a semiconductor device according to the embodiment hereof.
Figure 27:
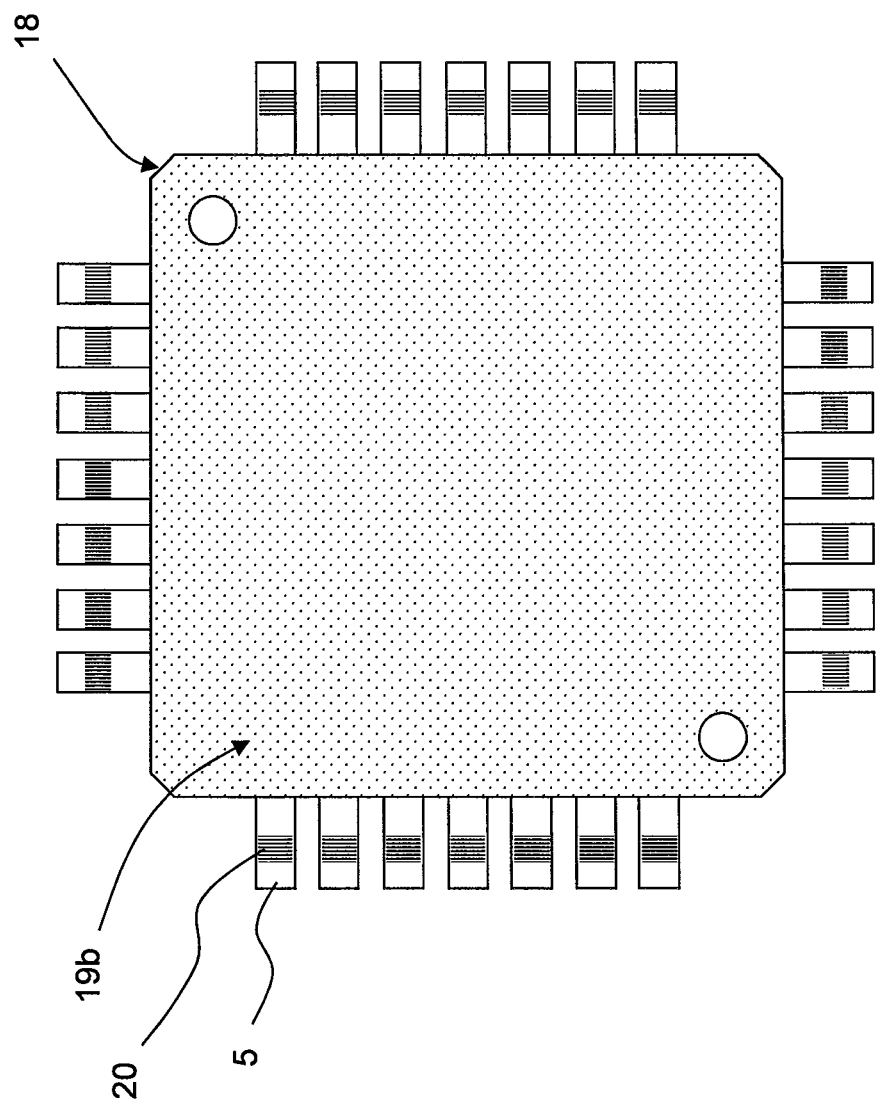
FIG. 27 is a bottom view of the separated package (sealed body) for explaining the assembly process final stage (lead-shaping process) in the method of manufacturing a semiconductor device according to the embodiment hereof.
Figure 28:
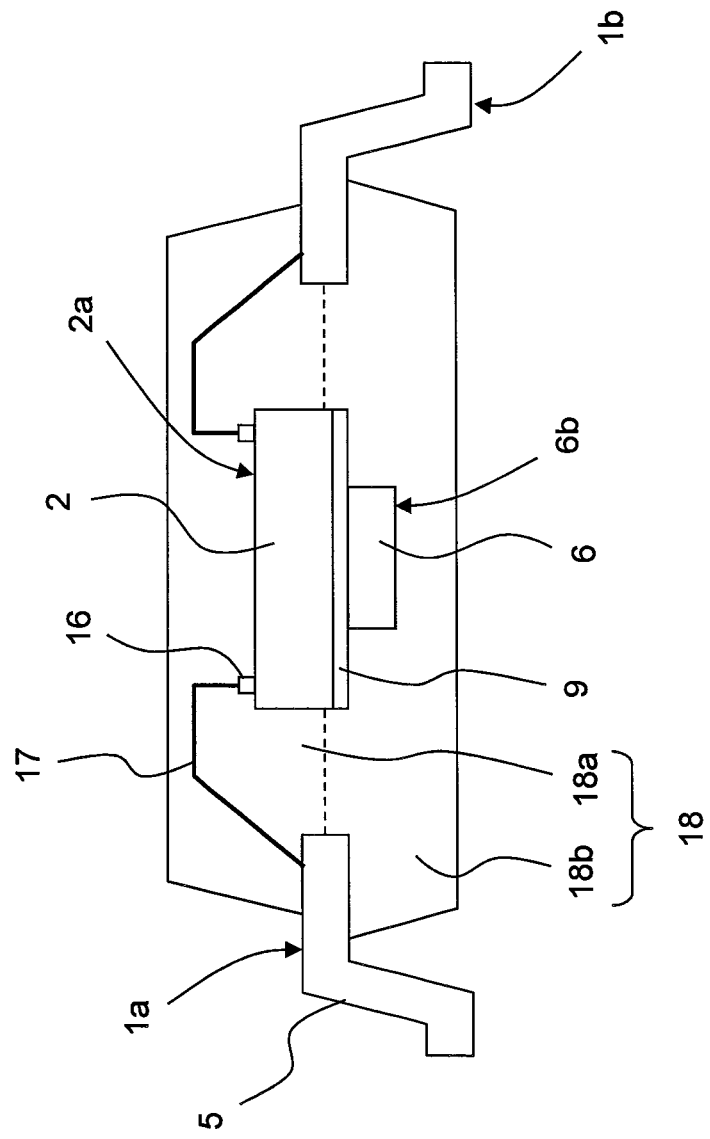
FIG. 28 is a sectional view showing a cross section taken along the line X-X' of FIG. 26.
Figure 29:
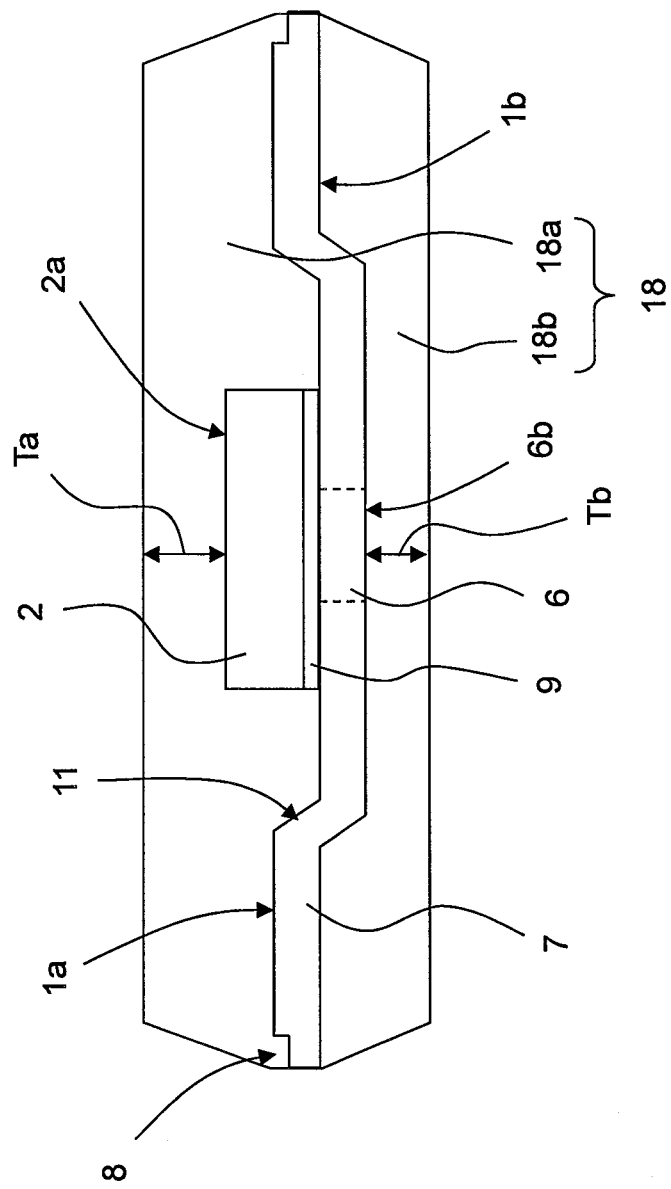
FIG. 29 is a sectional view showing a cross section taken along the line D-D' of FIG. 26.

FIG. 26 is a top view of a separated package (sealed body) for explaining the assembly process final stage (lead-shaping process) in the method of manufacturing a semiconductor device according to the embodiment hereof. FIG. 27 is a bottom view of the separated package (sealed body) for explaining the assembly process final stage (lead-shaping process) in the method of manufacturing a semiconductor device according to the embodiment hereof. FIG. 28 is a sectional view showing a cross section taken along the line X-X' of FIG. 26. FIG. 29 is a sectional view showing a cross section taken along the line D-D' of FIG. 26. The assembly process final stage (lead-shaping process) in the method of manufacturing a semiconductor device according to the embodiment hereof will be described with reference to the drawings.

The lead frame 1 (FIG. 24) after the completion of the tie-bar cutting is cut off from the frame part 3 into a package (which is a collection of a resin-sealed body 18, leads 5, etc.) on an as-needed basis. Then, the lead shaping is executed as required. Now, it is noted that the lead shaping and the cutting from the frame may be performed in any order. In addition, the treatment of lead plating is performed before or after these steps on an as-needed basis. FIG. 26 presents a top view of a package which has gone through the lead shaping. As shown in FIG. 26, the upper face 19a of the resin-sealed body 18 can be seen in the center part. Further, a number of leads 5 protrude from each side thereof, and each lead 5 is bent at its lead-bent part 20.

FIG. 27 presents a bottom view of the package subjected to the lead shaping. As shown in FIG. 27, the lower face 19b of the resin-sealed body 18 can be seen in the center part as in the case of FIG. 26. Further, a number of leads 5 protrude from each side hereof, and each lead 5 is bent at its lead-bent part 20.

FIG. 28 shows a cross section taken along the line X-X' of FIG. 26. As shown in FIG. 28, the inner end of each lead 5, a semiconductor chip 2, bonding pads 16, bonding wires 17, a die pad 6, etc. are housed in the resin-sealed body 18. The examples of main sizes in connection with the resin-sealed body 18 are shown here. The thickness of the sealed body is e.g. about 1.4 millimeters in the case of LQFP, whereas in the case of TQFP, it is e.g. about 1.1 millimeters. The chip thickness (in the case of the multilayered chip, the total thickness thereof) is e.g. about 280 micrometers, the silver paste thickness is e.g. about 10 micrometers. In addition, the length of each side of the sealed body (in the case of the sealed body of a substantially square form) is e.g. about 18 millimeters (the main range thereof is from 10 to 28 millimeters approximately).

FIG. 29 shows a cross section taken along the line D-D' of FIG. 26. As shown in FIG. 29, almost all parts of the die-pad-support lead 7 except its side faces at two opposing ends, the semiconductor chip 2, the die pad 6, and others are housed in the resin-sealed body 18. Further, in this embodiment, the thickness Ta of the first resin-sealed body 18a in the place where the semiconductor chip 2 and the die pad 6 are located is thicker than the thickness Tb of the second resin-sealed body 18b. The reason for this is to secure the loop height of the bonding wire.

Showing concrete examples of the sizes, the thickness Ta of the resin-sealed body 18a is e.g. about 590 micrometers, and the thickness Tb of the second resin-sealed body 18b is e.g. about 400 micrometers.

5. Description of various modifications in the two-dimensional shape of the lead frame in the method of manufacturing a semiconductor device according to the embodiment hereof (See FIGS. 30 to 32, chiefly.)

In the descriptions above, a small-area die pad (see FIG. 1, for instance) is taken as an example of the die pad chiefly, which has been described concretely. The embodiments are not limited to such small-area die pad as described below. The invention is applicable to processes in which lead frames having die pads of various areas or shapes are used. It is exactly the same as to the shape of the die-pad-support lead 7.

Figure 30:
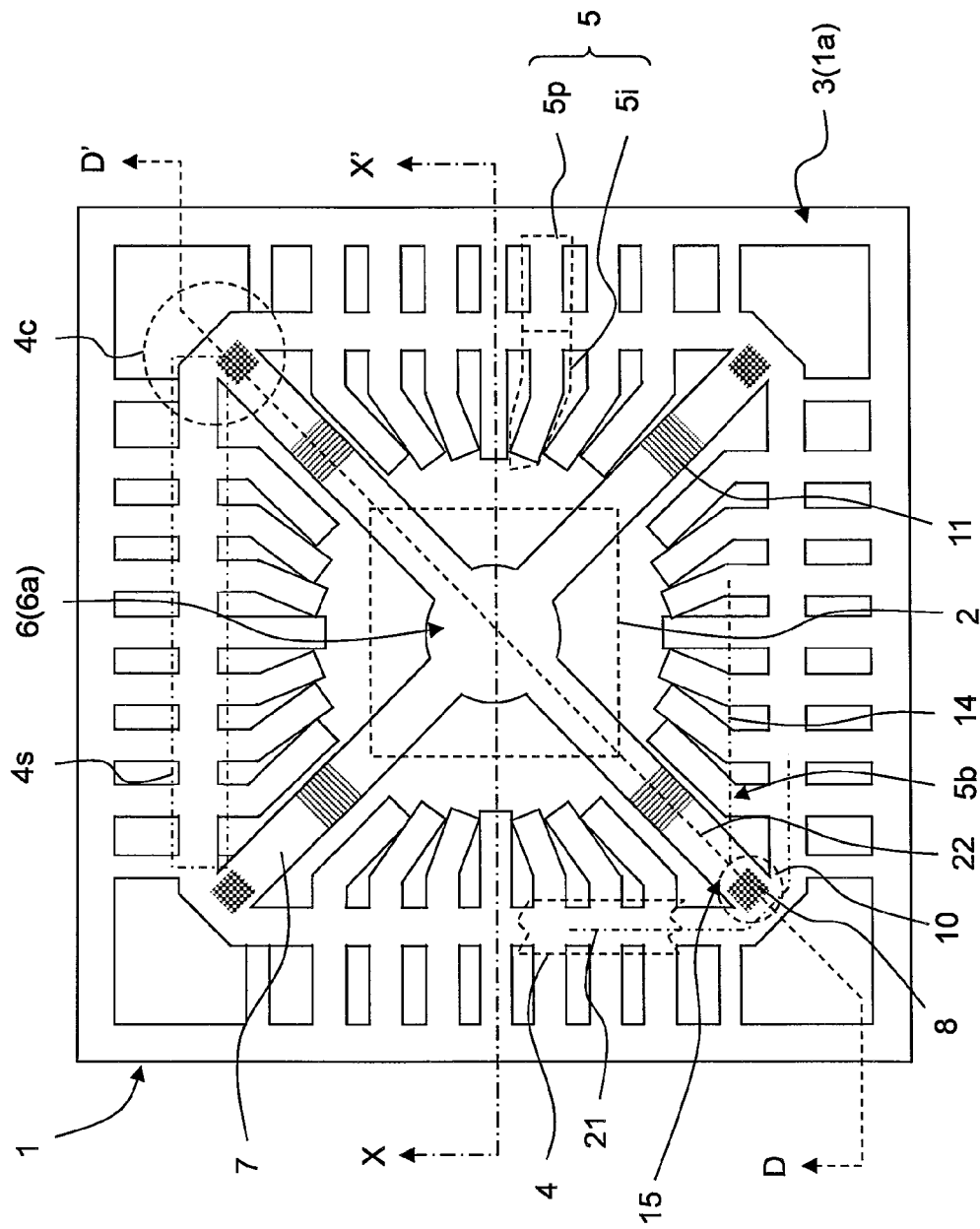
FIG. 30 is a top view of the lead frame for explaining a modification (specifically, a non-branch die-pad-support lead) in connection with the two-dimensional shape of the lead frame in the method of manufacturing a semiconductor device according to the embodiment hereof.
Figure 31:
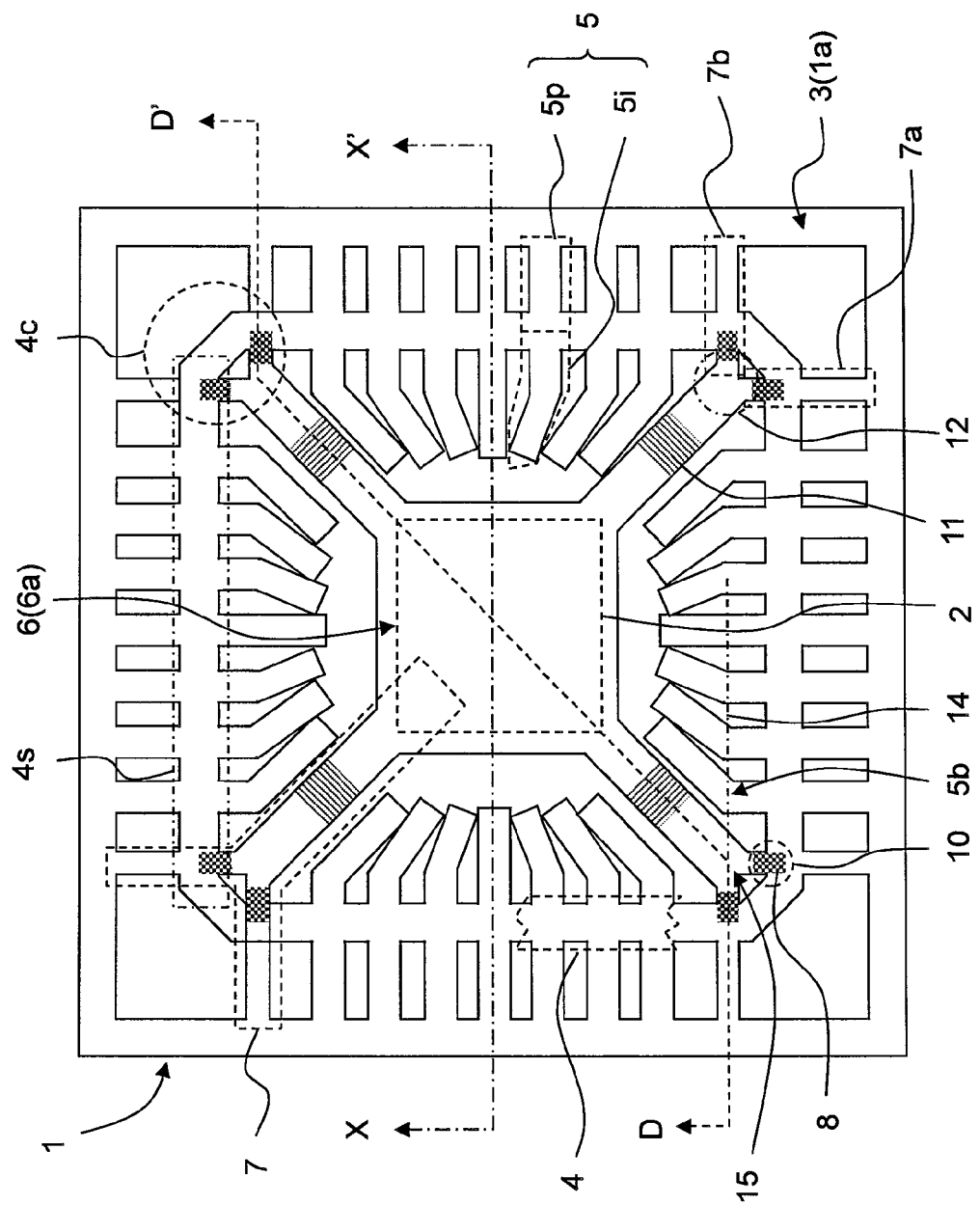
FIG. 31 is a top view of the lead frame for explaining a modification (specifically, a simple-large-area die pad) in connection with the two-dimensional shape of the lead frame in the method of manufacturing a semiconductor device according to the embodiment hereof.
Figure 32:
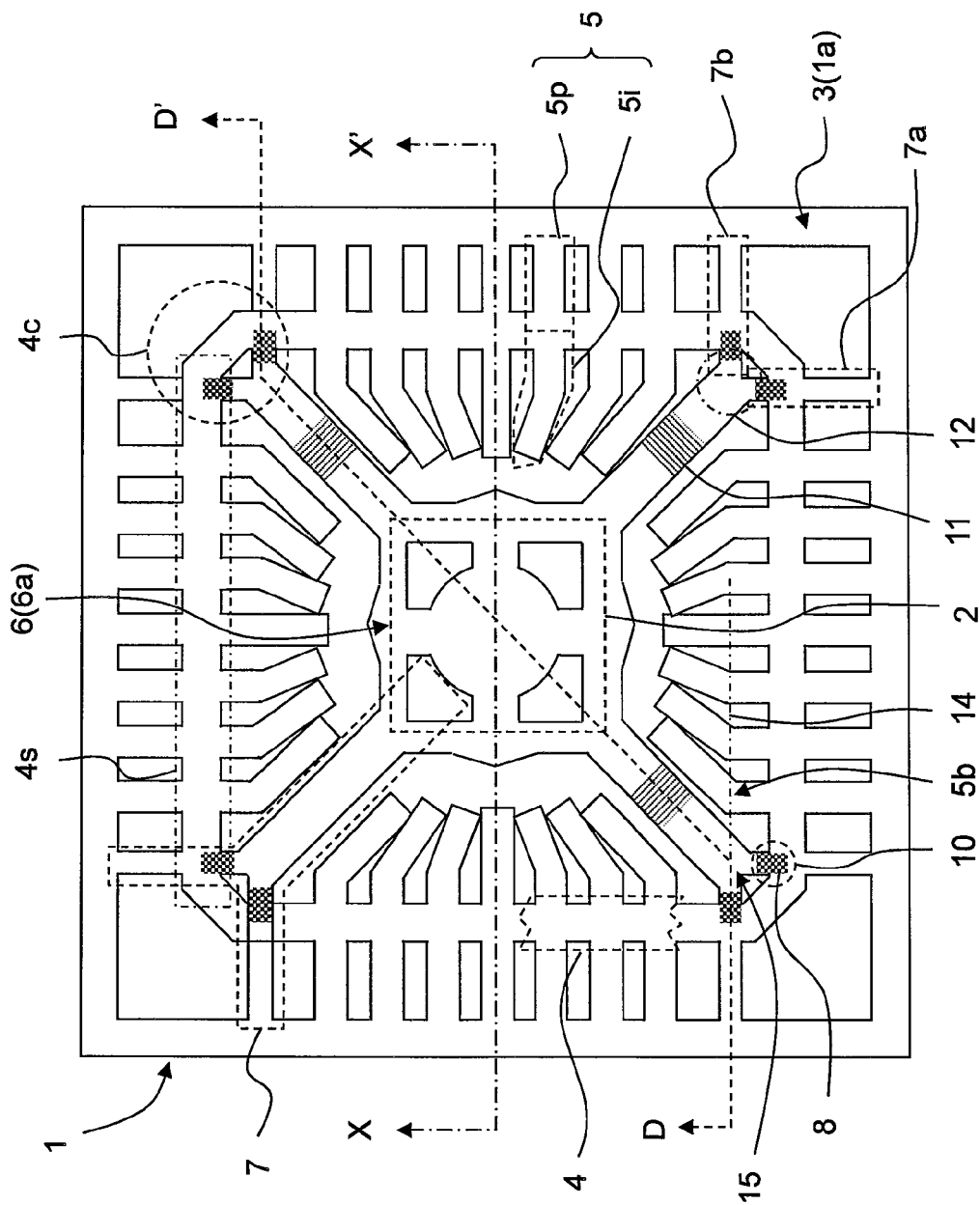
FIG. 32 is a top view of the lead frame for explaining a modification (specifically, an opened large-area die pad) in connection with the two-dimensional shape of the lead frame in the method of manufacturing a semiconductor device according to the embodiment hereof.

FIG. 30 is a top view of the lead frame for explaining a modification (specifically, a non-branch die-pad-support lead) in connection with the two-dimensional shape of the lead frame in the method of manufacturing a semiconductor device according to the embodiment hereof. FIG. 31 is a top view of the lead frame for explaining a modification (specifically, a simple-large-area die pad) in connection with the two-dimensional shape of the lead frame in the method of manufacturing a semiconductor device according to the embodiment hereof. FIG. 32 is a top view of the lead frame for explaining a modification (specifically, an opened large-area die pad) in connection with the two-dimensional shape of the lead frame in the method of manufacturing a semiconductor device according to the embodiment hereof. The various modifications in connection with the two-dimensional shape of the lead frame in the method of manufacturing a semiconductor device according to the embodiment hereof will be described with reference to these drawings.

(1) Non-branch die-pad-support lead (See FIG. 30, chiefly.):

The two-dimensional shape of the die-pad-support lead 7 shown in FIG. 30 is characterized in that the die-pad-support lead 7 does not branch on the side closer to the die bar 4 unlike the embodiments including that of FIG. 1. In this case, the die-pad-support lead 7 has no branch and as such, an inner-side range of a preferred position to form the concaved part 8 is the intersection point 15 of: a straight line 14 extending through the bent part 5b of the lead 5 (the inner lead part 5i) adjacent to the die-pad-support lead 7 in parallel with the side 4s of the tie-bar 4 crossing the lead 5; and the die-pad-support lead 7 (more exactly, the center line 22 of the die-pad-support lead 7).

This arrangement is simple in structure, has substantially fourfold rotation symmetry, and is superior in the stability in holding the die pad. In contrast, the die-pad-support lead 7 with a branch has the effect of relaxing upward and downward shifts of the die pad owing to a clamp pressure as described below.

(2) Simple-large-area die pad (See FIG. 31, chiefly.):

The two-dimensional shape of the die pad 6 shown in FIG. 31 is characterized in that the semiconductor chip 2 is involved in the die pad 6 in plane view unlike the embodiments including that of FIG. 1. The simple-large-area die pad 6 has e.g. a substantially rectangular shape, and has no macro-scale opening therein. Therefore, the entire rear face of the semiconductor chip 2, and an end lower face thereof are totally protected by the die pad 6. Further, the die-pad-support lead 7 can be made shorter in comparison to the die-pad-support lead for the small-area die pad as shown in FIG. 1 and as such, the large-area die pad has the advantage that upward and downward shifts of the die pad 6 caused by the clamp pressure become smaller.

Incidentally, the simple-large-area die pad may have a macro-scale opening as in the modification as described below.

(3) Opened large-area die pad (See FIG. 32, chiefly.):

The two-dimensional shape of the die pad 6 shown in FIG. 32 is characterized in that the semiconductor chip 2 is involved in the die pad 6 in plane view as in the case of FIG. 31. Further, this modification has an additional feature such that the die pad has a macro-scale opening therein.

The opened large-area die pad according to this modification has the same advantage as the simple-large-area die pad shown in FIG. 31 and in addition, an advantage such that the adhesiveness to the sealing resin is improved as in case of the small-area die pad as shown in FIG. 1.

6. Description of a modification in connection of the sealing process in the method of manufacturing a semiconductor device according to the embodiment hereof (See FIG. 33, chiefly.)

What is described here is a modification in connection with, of the assembly processes which have been described in the sections 1 to 4, the sealing process (the section 2). Basically the descriptions having been presented in the sections 1 to 5 hold true for this section substantially as they are. Therefore, only different points will be described below as a rule.

Figure 33:
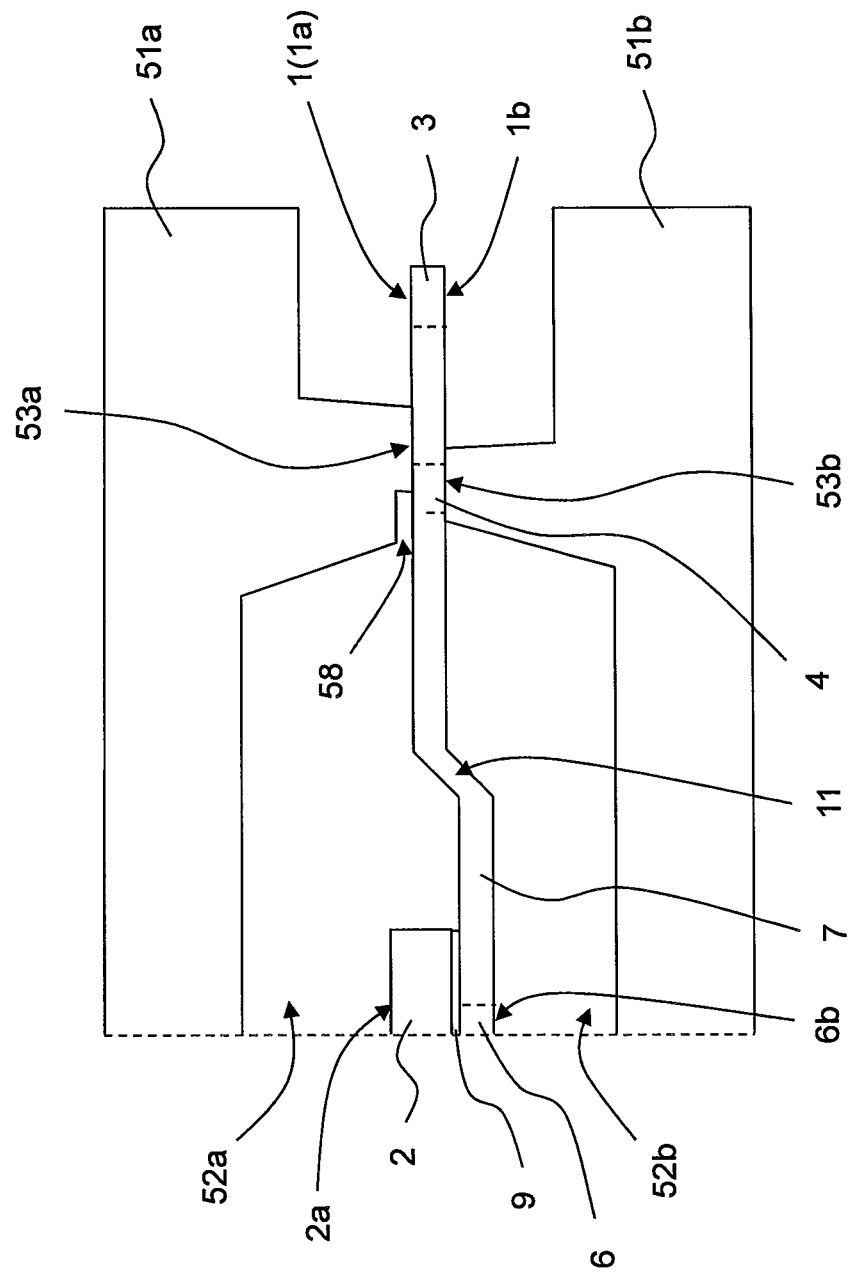
FIG. 33 is a schematic sectional view (in the step of clamping the lead frame) for explaining a modification in connection with the sealing process in the method of manufacturing a semiconductor device according to the embodiment hereof, which corresponds to FIG. 12.

FIG. 33 is a schematic sectional view (in the step of clamping the lead frame) for explaining a modification in connection with the sealing process in the method of manufacturing a semiconductor device according to the embodiment hereof, which corresponds to FIG. 12. The modification in connection with the sealing process in the method of manufacturing a semiconductor device according to the embodiment hereof will be described with reference to the drawing.

As shown in FIG. 33, no concaved part is formed on the side of the lead frame 1 unlike the state as shown in FIG. 12. Alternatively, a concaved part (i.e. a clamp-face concaved part 58) is formed in a corresponding part of the die (e.g. the upper die 51a, namely the first molding die).

While the lead frame 1 without the concaved part is used in this modification, the lead frame 1 with the concaved part formed therein may be used as in the embodiment shown in FIG. 12. However, using the lead frame 1 without the concaved part rather than the lead frame with the concaved part formed therein brings about the advantages of: being able to reduce the manufacturing cost of the lead frame 1, being able to secure the strength of the lead frame 1, and the like. Also, the clamp-face concaved part 58 may be formed in the lower die 51b (i.e. the second molding die). Further, the clamp-face concaved part 58 may be formed in both of the clamp faces 53a and 53b of the upper and lower dies 51a and 51b. Now, it is noted that the preferred size of the clamp-face concaved part 58 and the preferred position thereof are the same as those of the concaved part 8 formed in the lead frame 1.

Further, using the lead frame 1 with no concaved part, and the die having the clamp-face concaved part 58 as shown in FIG. 33, for example, brings about the advantages of: being able to reduce the manufacturing cost of the lead frame 1, being able to secure the strength of the lead frame 1, and the like. However, using the lead frame 1 with the concaved part formed therein, and the die without the clamp-face concaved part 58 in combination as shown in FIG. 12, for example, is advantageous in that it is possible to commonly use the die for more types of lead frames.

7. Further description for the embodiments (including the modifications), and general consideration therefor (See FIG. 34, chiefly.)

Figure 34:
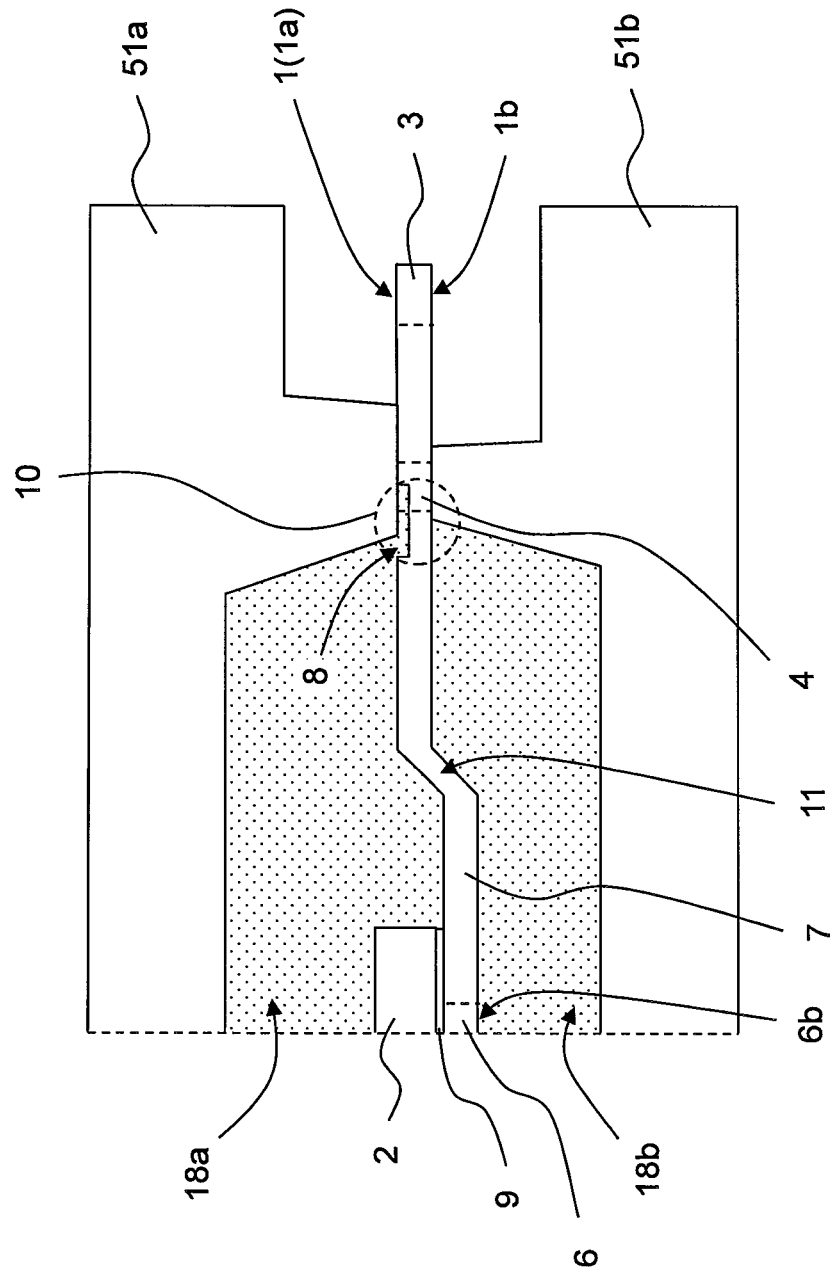
FIG. 34 is a schematic sectional view (in the resin sealing step) taken along the line M-M' of FIG. 11 for explaining the outline of the method of manufacturing a semiconductor device according to the embodiment hereof.

FIG. 34 is a schematic sectional view (in the resin sealing step) taken along the line M-M' of FIG. 11 for explaining the outline of the method of manufacturing a semiconductor device according to the embodiment hereof. The further description in connection with the embodiment (including the modification) and the general consideration thereof will be made with reference to the drawing.

(1) Outline of the method of manufacturing a semiconductor device according to the embodiment hereof (See FIG. 34, chiefly.)

As described above, in the mold process of the lead frame article, the resin is supplied into the cavity with the tie-bar (dam bar) of the lead frame clamped by the dies (in the case of the transfer mold). The clamp part is arranged to have a width larger than that of the tie-bar so that the tie-bar can be reliably clamped by the clamp parts of the dies in this step. Thus, the leads (i.e. the inner leads and the outer leads), and the hanging leads (i.e. the die-pad-support leads 7) are partially clamped by the dies. Then, with the hanging leads clamped by the dies, the hanging lead is deformed under the clamp pressure. In this situation, if the clamp part of the upper die 51a is larger, in width, than the clamp part of the lower die 51b as shown in FIG. 34, for example, the position of the die pad to which the hanging leads are connected tends to shift downward (toward the direction to which the die pad is offset in FIG. 34). In case that the die pad shifts to below a predetermined position, the sealed body to be formed on the side of the lower face of the die pad which has been offset (i.e. down set in this case) ends up being formed to be thinner than a desired thickness. It has been found that as a result of this, in case that a stress is applied to the sealed body formed on the side of the lower face of the die pad, the stress can cause a package crack. The package crack is prone to occur in, of QFPs, a product having a smaller thickness in a resin formed on the side of the lower face of the die pad (e.g. LQFP or TQFP). Further, in the manufacture & inspection step, the package crack is often caused during the time of e.g. a temperature-cycle test (of e.g. about 200 cycles of a combination of −55 degrees centigrade, and 125 degrees centigrade. According to the study by the inventors hereof, it is expected that e.g. the delamination of the silver paste which makes an adhesive-member layer acts as a trigger, causing such package cracks in packages arranged so that the sealed body is formed on the side of the lower face of the die pad to have a smaller thickness than a desired thickness (in the case of the small-area die pad).

As a countermeasure to this, in the resin seal process in the method of manufacturing a semiconductor device according to the embodiment hereof, the concaved part 8 is formed on the side of the first principal face (1a, 6a) of the joint part 10 of the die-pad-support lead 7 of the lead frame 1, and the tie-bar 4, or the on the side of the second principal face (1b, 6b) as shown in FIG. 34. The arrangement like this prevents the clamp pressure from being concentrated on a part of the die-pad-support lead 7 located inside from and near the tie-bar 4, whereby the deformation of the die-pad-support lead 7 at that part is avoided. Therefore, the upward and downward shifts of the die pad 6 owing to the deformation at this part are never caused.

(2) Consideration about upward and downward movements of the die pad owing to the deformation of the die-pad-support lead Here, consideration will be made on the upward and downward movements of the die pad attributed to a clamp pressure by the dies caused in the case of the lead frame having no concaved part as already described in connection with the method of manufacturing a semiconductor device according to the embodiment hereof. This subsection is premised on e.g. a lead frame which is similar, in shape, to the lead frames shown in the drawings to which reference was made so far (except FIG. 33), but has no concaved part 8 as shown in FIG. 33.

The lead frame having a simple structure as shown in FIG. 30 (the I type die-pad-support lead) will be described first. The quantity by which the lead frame is crushed by the clamp pressure is usually considered to be about 10 micrometers in the case of the lead frame having a thickness of about 125 micrometers. Therefore, even if the die pad is forced to move by the deformation (i.e. the reduction in the thickness of the die-pad-support lead caused by the clamp pressure) or by e.g. the die-pad-support lead being pushed down at the appropriate part, the quantity of the movement is about 10 micrometers at most, which accounts for about $\frac{1}{100}$ of one (1) millimeter serving as a rough standard of the package thickness, and cannot be a quantity posing a problem.

Now, assuming that the deformation changes the length of the die-pad-support lead, and thus the die pad is forced to move downward or upward, quantitative consideration will be performed. First, a quantity "$\Delta L$" of increase in the length "L" of the die-pad-support lead according to a quantity "$\Delta Tf$" of reduction in the thickness of the die-pad-support lead caused by the clamp pressure is usually considered not to be as much as "$\Delta Tf$", but to be smaller by an order. That is, it may be considered that "$\Delta L$ is as much as one (1) micrometer". Incidentally, the relation among the length "L" of the die-pad-support lead, an increase "$\Delta L$" thereof, and a quantity "$\Delta H$" of downward or upward movement of the die pad is approximately represented as follows: "$\Delta H \approx (2L \times \Delta L)^{1/2}$". Assuming "$L \approx 5$ millimeters" for the sake of simplicity, "$\Delta H \approx (2 \times 5000 \times 1)^{1/2} \approx 100$ micrometers" can be obtained. Even in comparison to one (1) millimeter serving as a rough standard of the package thickness, the quantity of the movement can be sufficiently regarded as possibly making some cause of a failure.

The reason why such very small increase in the length of the die-pad-support lead is converted into a vertical movement of the larger die pad is that the die-pad-support leads are suspended from its surrounding parts, the die pad has no degree of freedom except that in a vertical direction and in addition, and a degree of the contribution of a vertical movement to the length near the height horizontally in parallel therewith, i.e. its initial height is relatively small. In other words, an increase in the length of the die-pad-support lead is small, and the length of the die-pad-support lead is a macro-scale quantity, and thus a quantity of vertical movement of the die pad can be regarded as being amplified into a semi-macro-scale quantity.

Next, the Y-type die-pad-support lead 7 as shown in FIG. 1 will be considered. First, it is assumed that the branch angle, i.e. an angle between the first branch 7a and the second branch 7b is 90 degrees. In this case, an increase "$\Delta L$" of the length of the die-pad-support lead (in this case, an effective length, i.e. the length "L" in terms of the I-type die-pad-support lead) is reduced to about 70% because of the difference between the important part (non-branch part) of the die-pad-support lead 7 and each branch in direction. In the case of the Y-type die-pad-support lead 7 (with a branch angle of 90 degrees), a quantity "$\Delta H$" of downward or upward movement of the die pad is reduced to about 85% in comparison to that in the case of the I-type die-pad-support lead.

Likewise, assuming a branch angle 120 degrees, an increase "$\Delta L$" in the length of the die-pad-support lead is reduced to about 50%. Therefore, in the case of the Y-type die-pad-support lead 7 (with a branch angle of 120 degrees), a quantity "$\Delta H$" of the downward or upward movement of the die pad is reduced to about 70% in comparison to that in the case of the I-type die-pad-support lead.

Further, assuming a branch angle of 180 degrees, the increase "$\Delta L$" in the length of the die-pad-support lead becomes zero (0). Accordingly, in the case of the Y-type die-pad-support lead 7 (with a branch angle of 180 degrees), i.e. the T-type die-pad-support lead, the quantity "$\Delta H$" of downward or upward movement of the die pad is theoretically becomes zero (0). However, in fact the same phenomenon is caused in the straight-line branch (composed of the first and second branches 7a and 7b which form a straight line in combination), and thus the branch part 12 (i.e. a center part of the straight-line branch) can be forced to shift upward or downward. Since one half of the length of the straight-line branch can be made shorter in comparison to the length of the die-pad-support lead 7 sufficiently, the quantity is considered to be about 10 micrometers at most. Therefore, the quantities of upward and downward shifts of the die pad 6 according to such this are comparable to it, which is considered to be no problem.

In the case of the T-type die-pad-support lead, there is apprehension that some problem arises because of the instability of the straight-line branch in the horizontal direction. In such case, the stability can be achieved by uniting the straight-line branch with the tie-bar 4 in the corner parts.

The various examples for the presence or absence of the branch, and the branch angle, which have been described above, are for explaining the lead frame without the concaved part 8. However, the differences of the effects associated with various structures for the die-pad-support-lead-outer-end portions hold true for the lead frame having the concaved part 8 as they are.

Further, it is obvious that various examples concerning the lead frame without the concaved part 8 which have been described in the subsection also constitute part of the embodiments (including the modifications) hereof. This holds true for other subsections.

(3) Consideration about the direction of movement

Next, the direction of vertical movement of the die pad will be considered. If the die pad and the die-pad-support lead are totally up and down symmetric in their cross section, for instance, the direction of movement is determined under the influence of the micro-scale asymmetry (i.e. static micro-scale asymmetry) existing in the structure or the like. On the other hand, in cases such that macro-scale asymmetries are involved owing to down-set processing, die bonding, and the like, it is considered that the movement in a certain direction is more likely to occur under the influence of those asymmetries. In cases such as the above-described embodiments, the die pad often shifts downward. If the die pad is moved downward, the sealed body formed on the side of the lower face of the die pad will be formed to be thinner than a desired thickness, which can cause a package crack and the like. On the other hand, if the die pad is moved upward, a problem such that bonding wire and the like are bared can be brought on.

On the other hand, in consideration of dynamic micro-scale asymmetry, to which of the downward and upward directions the die pad is forced to move can be determined depending on whether the inner-side part of the tie-bar is pushed down or up by the die or the like. Therefore, the effect of avoiding the occurrence of a downward dynamic micro-scale asymmetry is brought about by forming the concaved part in the upper face of the lead frame as shown in FIG. 3. This holds true for the case of FIG. 33.

(4) Consideration about the interrelation between the thickness of the upper resin-sealed body (on the chip front face side), and the thickness of the lower resin-sealed body (on the chip rear face side) in a position (chip-&-die-pad position) where a semiconductor chip and a die pad are placed:

In regard to the respective embodiments, a case such that the upper resin-sealed body is thicker, in thickness, than the lower resin-sealed body mainly in the chip-&-die-pad position has been concretely described as an example. However, it is obvious that the various embodiments (including the modifications) described above are applicable to both the case where the thickness of the upper resin-sealed body is smaller than that of the lower resin-sealed body in the chip-&-die-pad position, and the case where the thickness of the upper resin-sealed body is comparable to that of the lower resin-sealed body in the chip-&-die-pad position. This is because the direction of movement of the die pad is not necessarily the same for any cases, so a problem can equally occur for both the case where the upper resin-sealed body is thinner, and the case where the lower resin-sealed body is thinner. Further, even in the case where the upper and lower resin thicknesses are comparable to each other, it becomes an important problem to avoid a crack in the lower face, the baring of a wire from the upper face side, and the like in consideration with a package formed in a thin film.

8. Summary

The invention made by the inventor has been concretely described above based on the embodiments. The invention is not limited to the embodiments. It is obvious that various changes and modifications may be made without departing from the subject matter hereof.

In regard to the embodiments above, for instance, a lead frame arranged so that the die pad becomes smaller than the semiconductor chip in outer size has been taken as an example and described chiefly. However, the invention hereof is not limited to the embodiments. It is obvious that the invention is also applicable to a lead frame arranged so that the die pad becomes larger than the semiconductor chip in outer size.

While for the embodiments described above, the example that the gate part is formed on both of the lower and upper dies has been described chiefly, the invention hereof is not limited to the embodiments.

It is obvious that the invention is applicable to a case where the gate part is formed on only one of the lower die and the upper die.

Further, while in the embodiments, the lead frame subjected to the down-set processing has been taken as an example chiefly and concretely described, the invention hereof is not limited to the embodiments. It is obvious that the invention is applicable to a case where a lead frame which has not experienced the down-set processing is used.

What is claimed is:

1. A method of manufacturing a semiconductor device, comprising the steps of:
    (a) providing a lead frame having
        (x1) a frame part having a substantially rectangular frame-like portion,
        (x2) a tie-bar having a substantially rectangular frame-like portion, wherein the tie-bar is supported by the frame part, and formed inside therefrom,
        (x3) a plurality of leads extending inward and outward from each of four sides of the tie-bar,
        (x4) a die pad formed inside the tie-bar, and having first and second principal faces,
        (x5) a die-pad-support lead extending inward from each corner part of the tie-bar or a joint part near the corner part, and joined to the die pad,
        (x6) a concaved part formed on the side of the first or second principal face of the joint part, and
        (x7) a down-set part formed in each die-pad-support lead so as to set the die pad on the side of the second principal face;
    (b) bonding a semiconductor chip to the first principal face of the die pad via an adhesive-member layer;
    (c) after the step (b), setting the lead frame between a first molding die having a first cavity and a second molding die having a second cavity such that the first and second cavities are opposed to each other, and such that the second principal face of the die pad faces toward the second cavity; and
    (d) forming first and second resin sealed bodies on the sides of the first and second principal faces of the die pad respectively by performing resin sealing while the first and second molding dies clamping the tie-bar and a part of the lead frame located around the tie-bar.

2. The method of manufacturing a semiconductor device according to claim 1, wherein the concaved part is formed on the side of the first principal face of the joint part.

3. The method of manufacturing a semiconductor device according to claim 2, wherein the adhesive-member layer is a silver paste layer.

4. The method of manufacturing a semiconductor device according to claim 3, wherein the concaved part is formed by etching.

5. The method of manufacturing a semiconductor device according to claim 4, wherein the die pad is included in the semiconductor chip in plane view.

6. The method of manufacturing a semiconductor device according to claim 5, wherein in the step (d), the first cavity is included in the second cavity in plane view.

7. The method of manufacturing a semiconductor device according to claim 6, wherein the first resin-sealed body is thicker than the second resin-sealed body in thickness in a place where the semiconductor chip and the die pad are located.

8. The method of manufacturing a semiconductor device according to claim 7, wherein each die-pad-support lead has first and second branches on the tie-bar side;
   the first branch is joined to the tie-bar through a first joint part near one side of corresponding one corner part of the tie-bar; and
   the second branch is joined to the tie-bar through a second joint part near the other side of the corner part.

9. The method of manufacturing a semiconductor device according to claim 8, wherein the concaved part is formed to extend outward from a branch part of the first and second branches to a depth of one half of the width of the tie-bar inside the tie-bar belonging to the joint part along a direction of the width of the tie-bar.

10. The method of manufacturing a semiconductor device according to claim 7, wherein each die-pad-support lead has substantially no branch on its tie-bar side.

11. The method of manufacturing a semiconductor device according to claim 10, wherein of the plurality of leads extending inward and outward from each side of the tie-bar, the leads at least adjacent to each die-pad-support lead each have a bent part inward from the tie-bar in the plane which the lead frame substantially belongs to.

12. The method of manufacturing a semiconductor device according to claim 11, wherein the concaved part is formed to extend outward from an intersection point of a straight line running through the bent part in parallel with one side of the tie-bar closest to the concaved part, and the die-pad-support lead closest to the concaved part to a depth of one half of a width of the tie-bar inside the tie-bar belonging to the joint part.

13. A method of manufacturing a semiconductor device comprising the steps of:
   (a) providing a lead frame having
      (x1) a frame part having a substantially rectangular frame-like portion,
      (x2) a tie-bar having a substantially rectangular frame-like portion, wherein the tie-bar is supported by the frame part, and formed inside therefrom,
      (x3) a plurality of leads extending inward and outward from each of four sides of the tie-bar,
      (x4) a die pad formed inside from the tie-bar, and having first and second principal faces,
      (x5) a die-pad-support lead extending inward from each corner part of the tie-bar or a joint part near the corner part, and joined to the die pad, and
      (x6) a down-set part formed in each die-pad-support lead so as to set down the die pad on the side of the second principal face;
   (b) bonding a semiconductor chip to the first principal face of the die pad via an adhesive-member layer;
   (c) after the step (b), setting the lead frame between a first molding die having a first cavity and a second molding die having a second cavity such that the first and second cavities are opposed to each other, and such that the second principal face of the die pad faces toward the second cavity; and
   (d) forming first and second resin sealed bodies on the sides of the first and second principal faces of the die pad respectively by performing resin sealing while the first and second molding dies clamping the tie-bar and a part of the lead frame located around the tie-bar,
   wherein a clamp-face concaved part is formed in a part of the first or second molding die corresponding to the joint part.

14. The method of manufacturing a semiconductor device according to claim 13, wherein the clamp-face concaved part is formed in the first molding die.

* * * * *